United States Patent
Kumazaki et al.

(10) Patent No.: US 12,300,962 B2
(45) Date of Patent: May 13, 2025

(54) LASER DEVICE AND ELECTRONIC DEVICE MANUFACTURING METHOD

(71) Applicant: Gigaphoton Inc., Tochigi (JP)

(72) Inventors: Takahito Kumazaki, Oyama (JP); Osamu Wakabayashi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 252 days.

(21) Appl. No.: 18/177,088

(22) Filed: Mar. 1, 2023

(65) Prior Publication Data

US 2023/0208094 A1 Jun. 29, 2023

Related U.S. Application Data

(63) Continuation of application No. PCT/JP2020/039674, filed on Oct. 22, 2020.

(51) Int. Cl.
*H01S 3/137* (2006.01)
*G03F 7/00* (2006.01)
*H01S 3/13* (2006.01)

(52) U.S. Cl.
CPC .......... *H01S 3/137* (2013.01); *G03F 7/70025* (2013.01); *H01S 3/1305* (2013.01)

(58) Field of Classification Search
CPC .. H01S 3/137; H01S 3/08004; H01S 3/08009; H01S 3/10069; H01S 3/106;

(Continued)

(56) References Cited

U.S. PATENT DOCUMENTS

| | | | | |
|---|---|---|---|---|
| 5,856,991 A | * | 1/1999 | Ershov | H01S 3/1055 372/19 |
| 7,489,715 B2 | * | 2/2009 | Hadrich | H01S 3/1062 372/29.016 |

(Continued)

FOREIGN PATENT DOCUMENTS

| | | |
|---|---|---|
| JP | H07-058393 A | 3/1995 |
| JP | 2013-179247 A | 9/2013 |

(Continued)

OTHER PUBLICATIONS

International Search Report issued in PCT/JP2020/039674; mailed Dec. 15, 2020.

(Continued)

*Primary Examiner* — Deoram Persaud
(74) *Attorney, Agent, or Firm* — Studebaker Brackett PLLC

(57) ABSTRACT

A laser device includes a first actuator configured to adjust an oscillation wavelength of pulse laser light; a second actuator configured to adjust a spectral line width of the pulse laser light; and a processor configured to determine a target spectral line width by reading data specifying a number of irradiation pulses of the pulse laser light with which one location of an irradiation receiving object is irradiated and a difference between a shortest wavelength and a longest wavelength, control the second actuator based on the target spectral line width, and control the first actuator so that the oscillation wavelength periodically changes every number of the irradiation pulses between the shortest wavelength and the longest wavelength.

20 Claims, 21 Drawing Sheets

(58) Field of Classification Search
CPC ........ H01S 3/1305; H01S 3/225; H01S 3/036;
H01S 3/08; H01S 3/0805; H01S 3/0809;
H01S 3/0826; H01S 3/0971; H01S
3/10038; H01S 3/10046; H01S 3/104;
H01S 3/1055; G03F 7/70025; G03F 7/20;
G03F 7/70575; G03F 7/70041
See application file for complete search history.

(56) References Cited

U.S. PATENT DOCUMENTS

| | | |
|---|---|---|
| 7,565,084 B1 | 7/2009 | Wach |
| 12,111,577 B2* | 10/2024 | Kumazaki ............... H01S 3/106 |
| 2002/0167975 A1 | 11/2002 | Spangler et al. |
| 2005/0083983 A1 | 4/2005 | Sandstrom et al. |
| 2008/0181262 A1 | 7/2008 | Wakabayashi et al. |
| 2010/0007864 A1* | 1/2010 | Tsuchiya ............. G03F 7/70041 355/53 |
| 2013/0230064 A1 | 9/2013 | Tanaka et al. |
| 2018/0196347 A1 | 7/2018 | Minegishi et al. |
| 2018/0254600 A1 | 9/2018 | Kumazaki et al. |
| 2018/0254608 A1* | 9/2018 | Cable .................. H01S 5/18366 |
| 2020/0301286 A1 | 9/2020 | Conley et al. |
| 2021/0226414 A1 | 7/2021 | Miura et al. |
| 2022/0373896 A1* | 11/2022 | Fujii ................... G03F 7/70041 |
| 2023/0064314 A1* | 3/2023 | Kumazaki ........... H01S 3/10069 |

FOREIGN PATENT DOCUMENTS

| | | |
|---|---|---|
| WO | 2006/079078 A2 | 7/2006 |
| WO | 2017/068619 A1 | 4/2017 |
| WO | 2017/098625 A1 | 6/2017 |
| WO | 2020/095418 A1 | 5/2020 |

OTHER PUBLICATIONS

International Preliminary Report On Patentability and Written Opinion issued in PCT/JP2020/039674; issued Apr. 13, 2023.

An Office Action; mailed by the China National Intellectual Property Administration of the People's Republic of China on Sep. 9, 2024, which corresponds to Chinese Patent Application No. 202080103622.0 and is related to U.S. Appl. No. 18/177,088.

* cited by examiner

LASER DEVICE AND ELECTRONIC DEVICE MANUFACTURING METHOD

The present application claims the benefit of International Application No. PCT/JP2020/039674, filed on Oct. 22, 2020 the entire contents of which are hereby incorporated by reference.

BACKGROUND

1. Technical Field

The present disclosure relates to a laser device and an electronic device manufacturing method.

2. Related Art

Recently, in a semiconductor exposure apparatus, improvement in resolution has been desired for miniaturization and high integration of semiconductor integrated circuits. For this purpose, an exposure light source that outputs light having a shorter wavelength has been developed. For example, as a gas laser device for exposure, a KrF excimer laser device for outputting laser light having a wavelength of about 248 nm and an ArF excimer laser device for outputting laser light having a wavelength of about 193 nm are used.

The KrF excimer laser device and the ArF excimer laser device each have a large spectral line width of about 350 to 400 pm in natural oscillation light. Therefore, when a projection lens is formed of a material that transmits ultraviolet rays such as KrF laser light and ArF laser light, there is a case in which chromatic aberration occurs. As a result, the resolution may decrease. Then, a spectral line width of laser light output from the gas laser device needs to be narrowed to the extent that the chromatic aberration can be ignored. For this purpose, there is a case in which a line narrowing module (LNM) including a line narrowing element (etalon, grating, and the like) is provided in a laser resonator of the gas laser device to narrow a spectral line width. In the following, a gas laser device with a narrowed spectral line width is referred to as a line narrowing gas laser device.

LIST OF DOCUMENTS

Patent Documents

Patent Document 1: US Patent Application Publication No. 2002/0167975
Patent Document 2: US Patent Application Publication No. 2013/0230064
Patent Document 3: US Patent Application Publication No. 2005/0083983
Patent Document 4: Japanese Patent Application Publication No. H07-058393
Patent Document 5: US Patent Application Publication No. 2020/0301286

SUMMARY

A laser device according to an aspect of the present disclosure includes a first actuator configured to adjust an oscillation wavelength of pulse laser light; a second actuator configured to adjust a spectral line width of the pulse laser light; and a processor configured to determine a target spectral line width by reading data specifying a number of irradiation pulses of the pulse laser light with which one location of an irradiation receiving object is irradiated and a difference between a shortest wavelength and a longest wavelength, control the second actuator based on the target spectral line width, and control the first actuator so that the oscillation wavelength periodically changes every number of the irradiation pulses between the shortest wavelength and the longest wavelength.

An electronic device manufacturing method according to an aspect of the present disclosure includes generating pulse laser light using a laser device, outputting the pulse laser light to an exposure apparatus, and exposing a photosensitive substrate to the pulse laser light in the exposure apparatus to manufacture an electronic device. Here, the laser device includes a first actuator configured to adjust an oscillation wavelength of the pulse laser light; a second actuator configured to adjust a spectral line width of the pulse laser light; and a processor configured to determine a target spectral line width by reading data specifying a number of irradiation pulses of the pulse laser light with which one location of an irradiation receiving object is irradiated and a difference between a shortest wavelength and a longest wavelength, control the second actuator based on the target spectral line width, and control the first actuator so that the oscillation wavelength periodically changes every number of the irradiation pulses between the shortest wavelength and the longest wavelength.

BRIEF DESCRIPTION OF THE DRAWINGS

Embodiments of the present disclosure will be described below merely as examples with reference to the accompanying drawings.

DESCRIPTION OF EMBODIMENTS

Content

Figure 1:
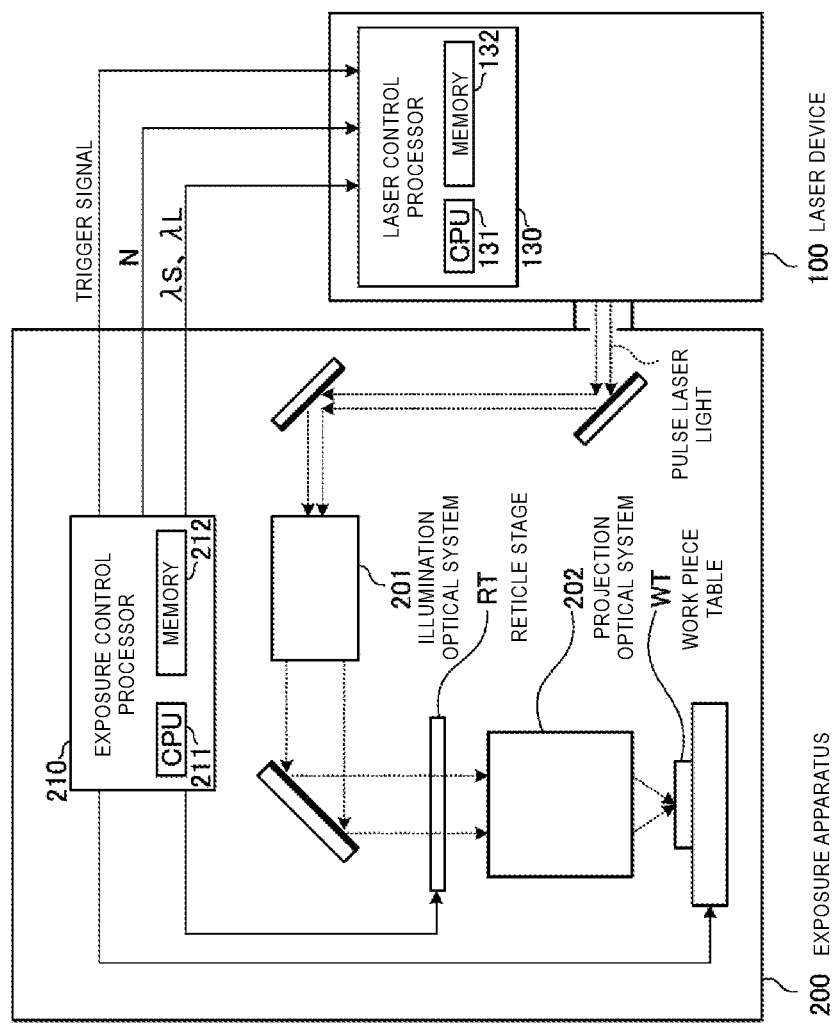
FIG. 1 schematically shows the configuration of an exposure system in a comparative example.

1. Comparative example
  1.1 Exposure system
    1.1.1 Configuration
    1.1.2 Operation
  1.2 Laser device 100
    1.2.1 Configuration
    1.2.2 Operation
  1.3 Line narrowing device 14
    1.3.1 Configuration
    1.3.2 Operation
  1.4 Number of irradiation pulses N
  1.5 Example of periodic wavelength change
    1.5.1 Sawtooth-waveform wavelength change
    1.5.2 Triangular-waveform wavelength change
    1.5.3 Triangular-waveform wavelength change in which wavelengths are shifted between first half and second half of cycle
  1.6 Problem of comparative example 2. Laser device 100*a* which brings moving integrated spectrum waveform close to preferred flat top shape by controlling spectral line width Δλ
   2.1 Configuration
   2.2 Operation
   2.3 Example of optical system which changes spectral line width Δλ
      2.3.1 Wavefront adjuster 15*e* arranged between output coupling mirror 15 and laser chamber 10
      2.3.2 Wavefront adjuster 15*h* configured of deformable mirror
      2.3.3 Wavefront adjuster 15*e* arranged between line narrowing device 14 and laser chamber 10
      2.3.4 Grating 53*a* capable of changing shape thereof
      2.3.5 First and second prisms 41, 42 which change beam expansion rate by rotating in opposite directions to each other
      2.3.6 Prism 47 which changes beam expansion rate by replacement
   2.4 Spectral line width control and wavelength control by laser control processor 130
   2.5 Control of spectral line width Δλ
   2.6 Effect
3. Laser device 100*a* in which target maximum spectral line width Δλmax is set
   3.1 Configuration and operation
   3.2 Effect
4. Laser device 100*a* which controls spectral line width Δλ into allowable range
   4.1 Configuration and operation
   4.2 Effect
5. Change of moving integrated spectrum waveform due to control of spectral line width Δλ
   5.1 Case in which wavelength is controlled in sawtooth waveform
   5.2 Case in which wavelength is controlled in triangular waveform
6. Others Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numerals, and duplicate description thereof is omitted.

1. Comparative Example

1.1 Exposure System

FIG. 1 schematically shows the configuration of an exposure system in a comparative example. The comparative example of the present disclosure is an example recognized by the applicant as known only by the applicant, and is not a publicly known example admitted by the applicant. The exposure system includes a laser device 100 and an exposure apparatus 200. In FIG. 1, the laser device 100 is shown in a simplified manner.

The laser device 100 includes a laser control processor 130. The laser device 100 is configured to output pulse laser light toward the exposure apparatus 200. The laser control processor 130 is a processing device including a memory 132 in which a control program is stored, and a central processing unit (CPU) 131 for executing the control program. The laser control processor 130 is specifically configured or programmed to perform various processes included in the present disclosure.

1.1.1 Configuration

As shown in FIG. 1, the exposure apparatus 200 includes an illumination optical system 201, a projection optical system 202, and an exposure control processor 210.

The illumination optical system 201 illuminates a reticle pattern of a reticle (not shown) arranged on a reticle stage RT with the pulse laser light incident from the laser device 100.

The projection optical system 202 causes the pulse laser light transmitted through the reticle to be imaged as being reduced and projected on a workpiece (not shown) arranged on a workpiece table WT. The workpiece is a photosensitive substrate such as a semiconductor wafer on which a resist film is applied.

The exposure control processor 210 is a processing device including a memory 212 in which a control program is stored and a CPU 211 which executes the control program. The exposure control processor 210 is specifically configured or programmed to perform various processes included in the present disclosure.

1.1.2 Operation

The exposure control processor 210 transmits data, including the number of irradiation pulses N, a shortest wavelength λS, and a longest wavelength λL, and a trigger signal to the laser control processor 130. The laser control processor 130 controls the laser device 100 in accordance with the data and the signal received from the exposure control processor 210. The exposure control processor 210 synchronously translates the reticle stage RT and the workpiece table WT in opposite directions with each other. Thus, the workpiece is exposed to the pulse laser light reflecting the reticle pattern. By such an exposure process, the reticle pattern is transferred onto the semiconductor wafer. Thereafter, an electronic device can be manufactured through a plurality of processes.

1.2 Laser Device 100

1.2.1 Configuration

Figure 2:
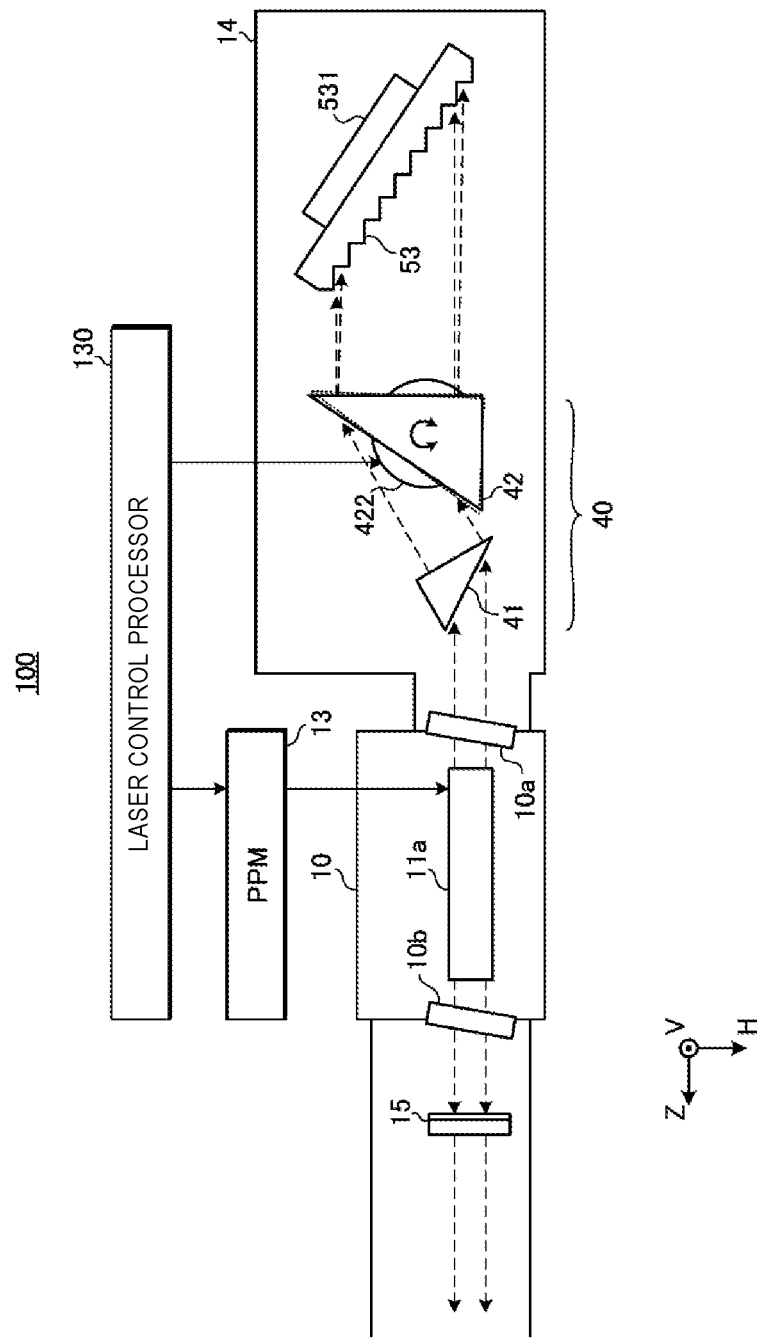
FIG. 2 schematically shows the configuration of a laser device in the comparative example.
Figure 3:
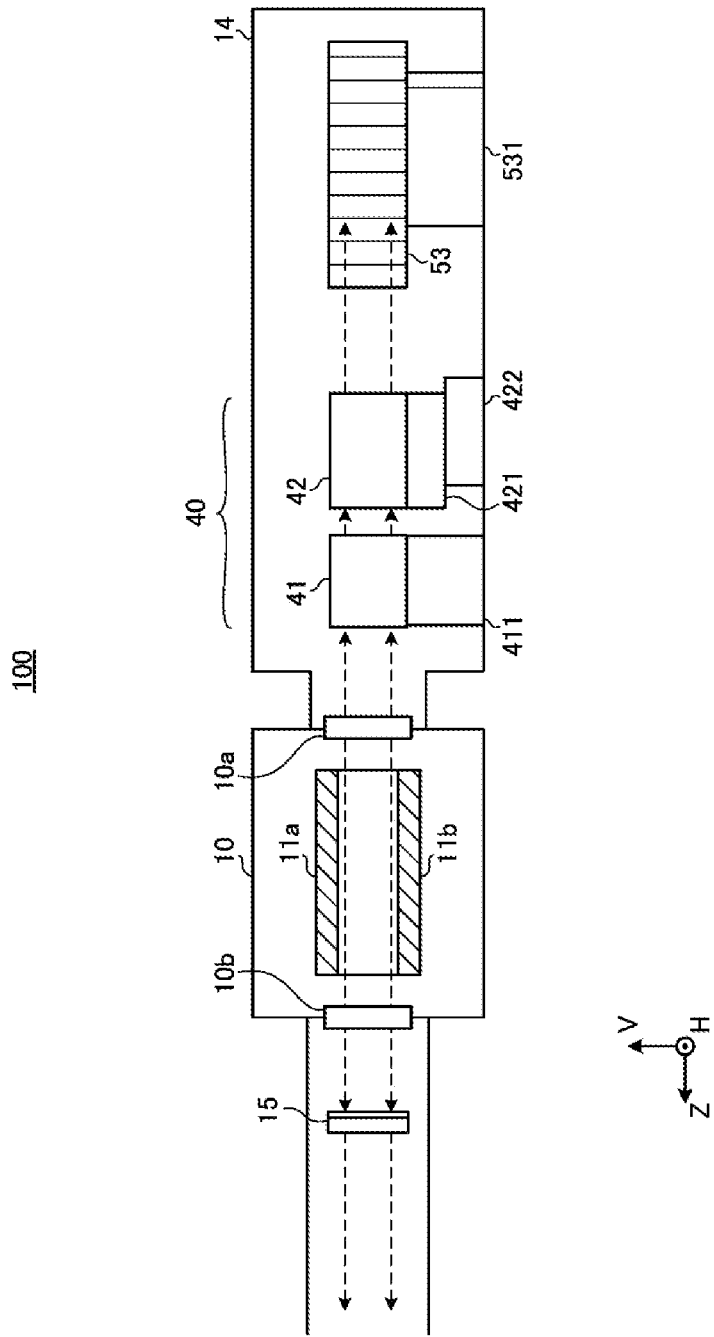
FIG. 3 schematically shows the configuration of the laser device in the comparative example.

FIGS. 2 and 3 schematically show the configuration of the laser device 100 in the comparative example. In FIGS. 2 and 3, the V axis, the H axis, and the Z axis perpendicular to each other are shown. FIG. 2 shows the laser device 100 as viewed in the −V direction and FIG. 3 shows the laser device 100 as viewed in the −H direction.

The laser device 100 includes a laser chamber 10, a pulse power module (PPM) 13, a line narrowing device 14, and an output coupling mirror 15 in addition to the laser control processor 130. The line narrowing device 14 and the output coupling mirror 15 configure an optical resonator.

The laser chamber 10 is arranged on the optical path of the optical resonator. The laser chamber 10 is provided with two windows 10*a*, 10*b*. The laser chamber 10 accommodates a pair of electrodes 11*a*, 11*b*, and further laser gas. For example, the laser gas includes fluorine gas, argon gas, and neon gas. As another example, the laser gas includes fluorine gas, krypton gas, and neon gas. The −V direction and the +V direction coincide with the direction in which the electrodes 11*a*, 11*b* face each other. The −Z direction coincides with the travel direction of the light beam output from the window 10a. The +Z direction coincides with the travel direction of the pulse laser light output from the window 10b and output via the output coupling mirror 15.

The pulse power module 13 includes a switch (not shown) and is connected to a charger (not shown).

The line narrowing device 14 includes a beam expander 40 including first and second prisms 41, 42, and a grating 53. Details of the line narrowing device 14 will be described later. The output coupling mirror 15 is configured by a partial reflection mirror.

1.2.2 Operation

The laser control processor 130 receives data including the number of irradiation pulses N, the shortest wavelength λS, and the longest wavelength λL from the exposure control processor 210. The data may be received from a lithography control device (not shown) separate from the exposure apparatus 200. The lithography control device may control a plurality of the exposure apparatuses 200. The laser control processor 130 transmits a control signal to the line narrowing device 14 based on the number of irradiation pulses N, the shortest wavelength λS, and the longest wavelength λL.

The laser control processor 130 receives the trigger signal from the exposure control processor 210. The laser control processor 130 transmits an oscillation trigger signal based on the trigger signal to the pulse power module. The switch included in the pulse power module 13 is turned on when the oscillation trigger signal is received from the laser control unit 31. When the switch is turned on, the pulse power module 13 generates a pulse high voltage from the electric energy charged in the charger, and applies the high voltage to the electrodes 11a, 11b.

When the high voltage is applied between the electrodes 11a, 11b, discharge occurs between the electrodes 11a, 11b. The laser gas in the laser chamber 10 is excited by the energy of the discharge and shifts to a high energy level. When the excited laser gas then shifts to a low energy level, light having a wavelength corresponding to the difference between the energy levels is emitted.

The light generated in the laser chamber 10 is output to the outside of the laser chamber 10 through the windows 10a, 10b. The light output from the window 10a enters the line narrowing device 14. Among the light having entered the line narrowing device 14, the light having a wavelength near a desired wavelength is returned from the line narrowing device 14 to the laser chamber 10.

The output coupling mirror 15 transmits and outputs part of the light output from the window 10b, and reflects the other part back into the laser chamber 10.

In this way, the light output from the laser chamber 10 reciprocates between the line narrowing device 14 and the output coupling mirror 15. The light is amplified each time when passing through a discharge space between the pair of electrodes 11a, 11b. Further, the light is narrowed each time when being turned back by the line narrowing device 14, and becomes light having a steep wavelength distribution with a part of a range of wavelength selected by the line narrowing device 14 as a center wavelength. Thus, the light having undergone laser oscillation and line narrowing is output as pulse laser light from the output coupling mirror 15. The wavelength of the pulse laser light refers to the center wavelength unless otherwise specified. The pulse laser light output from the laser device 100 enters the exposure apparatus 200.

1.3 Line Narrowing Device 14

1.3.1 Configuration

The first prism 41 is arranged on the optical path of the light beam output from the window 10a. The first prism 41 is supported by a holder 411. The second prism 42 is arranged on the optical path of the light beam having passed through the first prism 41. The second prism 42 is supported by a holder 421.

The first and second prisms 41, 42 are arranged such that the surfaces of the first and second prisms 41, 42 on which the light beam is incident and from which the light beam exits are parallel to the V axis. The second prism 42 is rotatable about an axis parallel to the V axis by a rotation stage 422. Here, examples of the rotation stage 422 include a rotation stage having high responsiveness rotated by a piezoelectric element.

The grating 53 is arranged on the optical path of the light beam having passed through the second prism 42. The direction of the grooves of the grating 53 coincides with the direction of the V axis. The grating 53 is supported by a holder 531.

1.3.2 Operation

The travel direction of the light output from the window 10a is changed by each of the first and second prisms 41, 42 in a plane parallel to the HZ plane which is a plane perpendicular to the V axis, and the beam width is expanded in the plane parallel to the HZ plane. The travel direction of the light having passed through both the first and second prisms 41, 42 toward the grating 53 substantially coincides with, for example, the −Z direction.

The light incident on the grating 53 from the second prism 42 is reflected by a plurality of grooves of the grating 53 and is diffracted in a direction corresponding to the wavelength of the light. The grating 53 is arranged in the Littrow arrangement, which causes the incident angle of the light beam incident on the grating 53 from the second prism 42 to coincide with the diffraction angle of the diffracted light having the desired wavelength.

The second prism 42 and the first prism 41 reduce the beam width of the light returned from the grating 53 in the plane parallel to the HZ plane and return the light into the laser chamber 10 through the window 10a.

The rotation stage 422 is controlled by the laser control processor 130. When the rotation stage 422 slightly rotates the second prism 42, the travel direction of the light output from the second prism 42 toward the grating 53 slightly changes in the plane parallel to the HZ plane. Therefore, the incident angle of the light incident on the grating 53 from the second prism 42 is slightly changed. Thus, the wavelength selected by the line narrowing device 14 is adjusted, and the oscillation wavelength of the pulse laser light is adjusted. The rotation stage 422 corresponds to the first actuator in the present disclosure.

The laser control processor 130 controls the rotation stage 422 of the second prism 42 based on the shortest wavelength λS and the longest wavelength λL received from the exposure control processor 210. The laser control processor 130 controls the rotation stage 422 for each pulse so that the posture of the second prism 42 periodically changes for every plurality of pulses. As a result, the wavelength of the pulse laser light changes in multiple steps between the shortest wavelength λS and the longest wavelength λL, and periodically changes for evert plurality of pulses. As described above, the laser device 100 can perform multiple wavelength oscillation for outputting pulse laser light having a plurality of wavelengths by changing the wavelength over a plurality of pulses.

The focal length in the exposure apparatus 200 (see FIG. 1) depends on the wavelength of the pulse laser light. The pulse laser light entering the exposure apparatus 200 through multiple wavelength oscillation can be focused on a number of different positions in the direction of the optical path axis of the pulse laser light, and the focal depth can be substantially increased. For example, even when a resist film having a large thickness is exposed, the imaging performance in the thickness direction of the resist film can be maintained.

1.4 Number of Irradiation Pulses N

Figure 4:
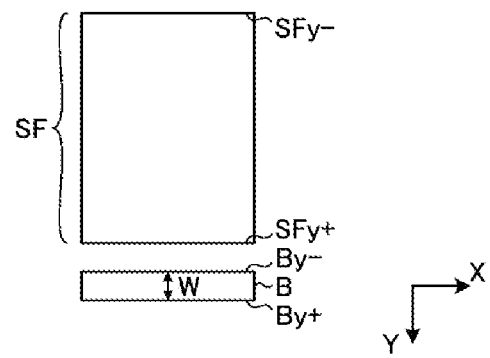
FIG. 4 shows how the position of a scan field of an irradiation receiving object changes with respect to the position of pulse laser light.
Figure 5:
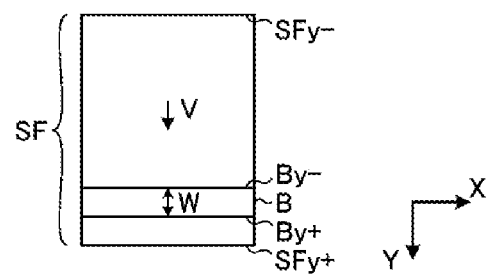
FIG. 5 shows how the position of the scan field of the irradiation receiving object changes with respect to the position of the pulse laser light.
Figure 6:
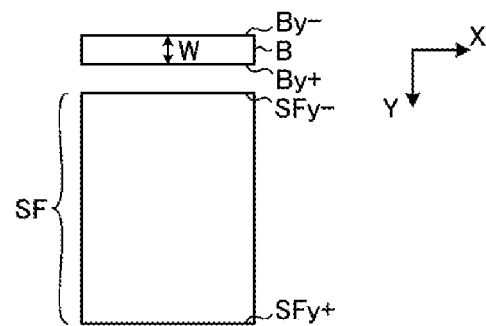
FIG. 6 shows how the position of the scan field of the irradiation receiving object changes with respect to the position of the pulse laser light.

FIGS. 4 to 6 show how the position of a scan field SF of an irradiation receiving object changes with respect to the position of the pulse laser light. The irradiation receiving object is, for example, a semiconductor wafer. The scan field SF of a semiconductor wafer corresponds, for example, to a region where some semiconductor chips among a number of semiconductor chips to be formed in a semiconductor wafer are formed. A resist film is applied to the scan field SF. The width of the scan field SF in the X-axis direction is the same as the width of a beam cross section B of the pulse laser light in the X-axis direction at the position of the irradiation receiving object. The width of the scan field SF in the Y-axis direction is larger than the width W of the beam cross section B of the pulse laser light in the Y-axis direction at the position of the irradiation receiving object.

The procedure of exposing the scan field SF with the pulse laser light is performed in the order of FIGS. 4, 5, and 6. First, as shown in FIG. 4, the workpiece table WT is positioned so that the position of an end SFy+ of the scan field SF in the +Y direction is spaced apart by a predetermined distance in the −Y direction with respect to the position of an end By− of the beam cross section B in the −Y direction. Then, the workpiece table WT is accelerated in the +Y direction so as to have a velocity V until the end SFy+ of the scan field SF in the +Y direction coincides with the position of the end By− of the beam cross section B in the −Y direction. As shown in FIG. 5, the workpiece table WT is moved such that the position of the scan field SF moves linearly at the constant velocity V with respect to the position of the beam cross section B. As shown in FIG. 6, when the workpiece table WT is moved until the position of the end By+ of the beam cross section B in the +Y direction passes the end SFy− of the scan field SF in the −Y direction, the exposure of the scan field SF is completed. In this way, the exposure is performed while the scan field SF moves with respect to the position of the beam cross section B.

The required time T for the scan field SF to move by the distance corresponding to the width W of the beam cross section B of the pulse laser light at the velocity V is as follows.

$$T=W/V$$

The number of irradiation pulses N of the pulse laser light radiated to any one location of the scan field SF is the same as the number of pulses of the pulse laser light generated in the required time T as follows.

$$N=F*T=F*W/V$$

Here, F is the repetition frequency of the pulse laser light. The number of irradiation pulses N is also referred to as an N slit pulse number.

1.5 Example of Periodic Wavelength Change

1.5.1 Sawtooth-Waveform Wavelength Change

Figure 7:
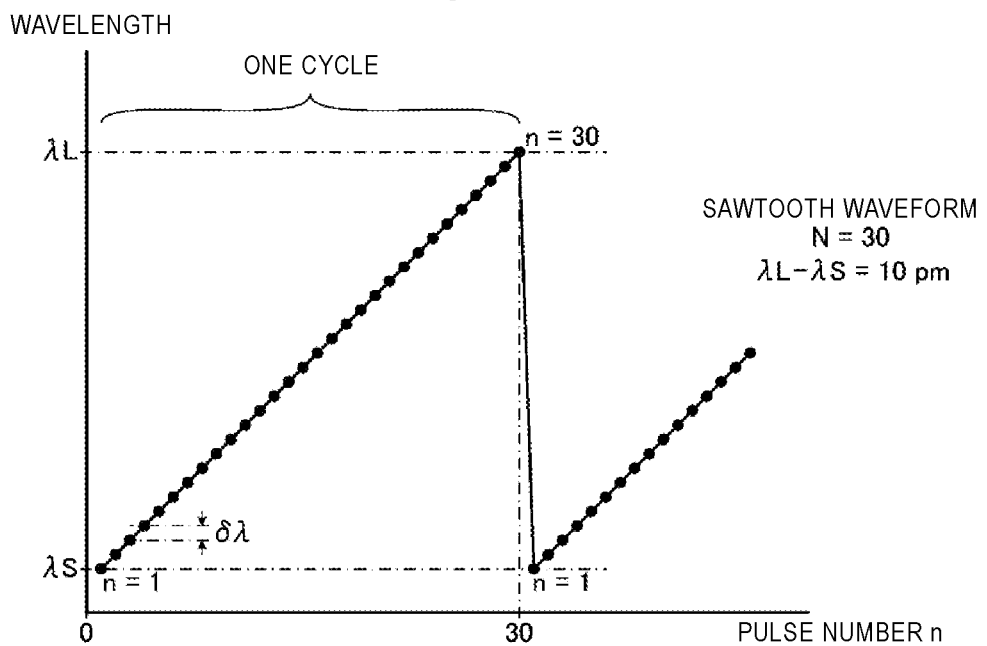
FIG. 7 is a graph showing a first example of periodic wavelength change in the comparative example.
Figure 9:
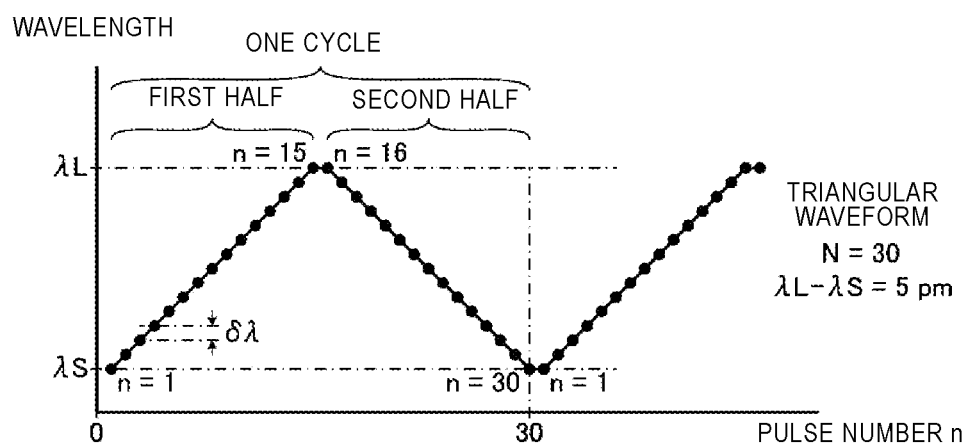
FIG. 9 is a graph showing a second example of periodic wavelength change in the comparative example.
Figure 11:
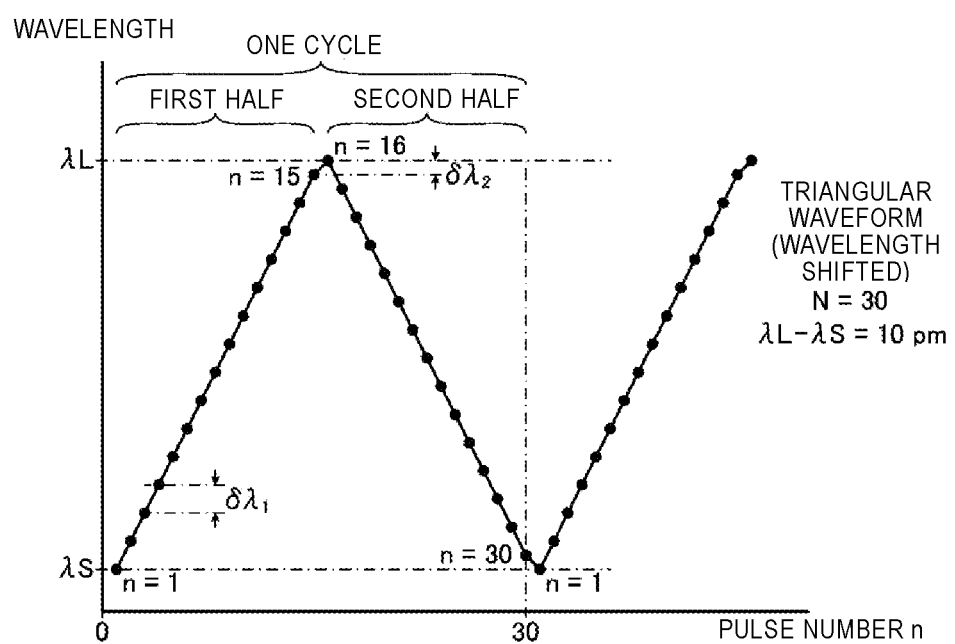
FIG. 11 is a graph showing a third example of periodic wavelength change in the comparative example.

FIG. 7 is a graph showing a first example of periodic wavelength change in the comparative example. In FIG. 7 and FIGS. 9 and 11 described later, the horizontal axis represents a pulse number n and the vertical axis represents a wavelength. It is assumed that the pulse number n is an integer from 1 to 30, and the next pulse number n after 30 returns to 1.

In the example shown in FIG. 7, the wavelength periodically changes every 30 pulses between the shortest wavelength λS and the longest wavelength λL. Specifically, while the pulse laser light of 30 pulses from the first (n=1) to the 30th (n=30) is generated, the wavelength changes from the shortest wavelength λS to the longest wavelength λL to be lengthened by a constant wavelength shift amount δλ for each pulse. Thereafter, the wavelength of the 31st (n=1) pulse is returned to the shortest wavelength λS, and similarly, the wavelength is repeatedly changed from the shortest wavelength λS to the longest wavelength λL with 30 pulses as one cycle. The number of irradiation pulses N is set to 30. The wavelength change as shown in FIG. 7 is hereinafter referred to as sawtooth-waveform wavelength change.

The wavelength shift amount δλ is a value that defines a change amount of the wavelength for each pulse. In the case of controlling the wavelength in a sawtooth waveform, the wavelength shift amount δλ is calculated by the following equation.

$$\delta\lambda=(\lambda L-\lambda S)/(N-1)$$

When the number of irradiation pulses N is 30 (N=30), the wavelength shift amount δλ is a value obtained by dividing the difference λL−λS between the shortest wavelength λS and the longest wavelength λL by 29.

Figure 8:
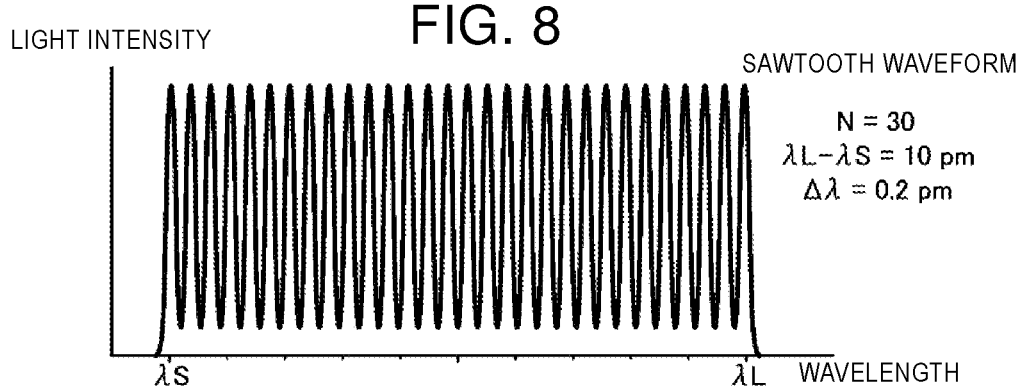
FIG. 8 shows a moving integrated spectrum waveform of 30 pulses in the wavelength change shown in FIG. 7.
Figure 10:
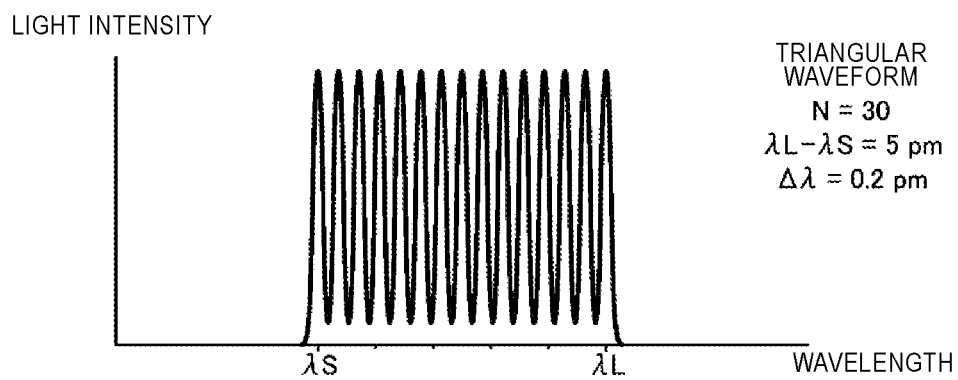
FIG. 10 shows a moving integrated spectrum waveform of 30 pulses in the wavelength change shown in FIG. 9.
Figure 12:
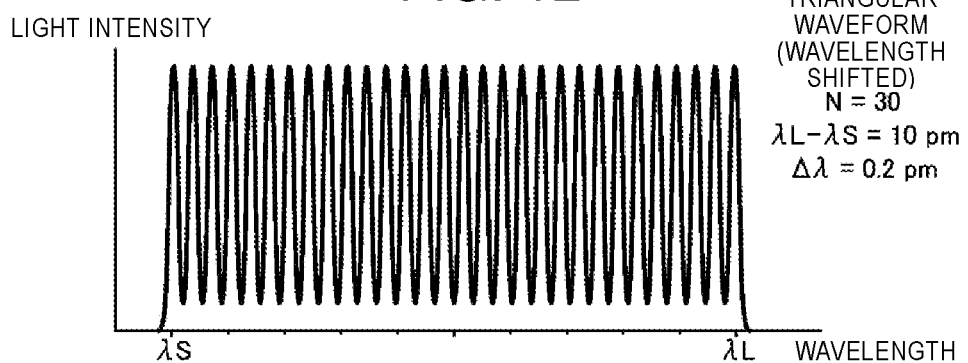
FIG. 12 shows a moving integrated spectrum waveform of 30 pulses in the wavelength change shown in FIG. 11.

FIG. 8 shows moving integrated spectrum waveform of 30 pulses in the wavelength change shown in FIG. 7. In FIG. 8 and FIGS. 10 and 12 described later, the horizontal axis represents the wavelength and the vertical axis represents light intensity. In the wavelength change shown in FIG. 7, since the wavelength is changed in multiple steps between the shortest wavelength λS and the longest wavelength λL, the moving integrated spectrum shown in FIG. 8 includes a plurality of peaks between the shortest wavelength λS and the longest wavelength λL. In FIG. 8, 30 peaks appear. When the light intensity of 30 pulses is maintained substantially constant, the plurality of peaks shown in FIG. 8 have substantially the same light intensity. In the sawtooth-waveform wavelength change, the wavelength difference between the peaks in the moving integrated spectrum waveform is the same as the wavelength shift amount δλ.

In the wavelength change shown in FIG. 7, the moving integrated spectrum waveform of 30 pulses is the same regardless of starting from any pulse. For example, the moving integrated spectrum waveform is the same for the 30 pulses from the first (n=1) to the 30th (n=30), for the 30 pulses from the second (n=2) to the 31st (n=1), and for the 30 pulses starting from any other pulse. Therefore, the 30 pulses radiated to any part of the scan field SF of the irradiation receiving object has the same moving integrated spectrum waveform. This makes it possible to manufacture a high-quality electronic device with little variation in the exposure result depending on the irradiation position.

1.5.2 Triangular-Waveform Wavelength Change

FIG. 9 is a graph showing a second example of periodic wavelength change in the comparative example. In the example shown in FIG. 9, while the pulse laser light of 15 pulses from the first (n=1) to the 15th (n=15) is generated, the wavelength changes from the shortest wavelength λS to the longest wavelength λL to be lengthened by the constant wavelength shift amount δλ for each pulse. Thereafter, while the pulse laser light of 15 pulses from the 16th (n=16) to the 30th (n=30) is generated, the wavelength changes from the longest wavelength λL to the shortest wavelength λS to be shortened by the constant wavelength shift amount δλ for each pulse. Similarly thereafter, with 30 pulses as one cycle, generation of 15 pulses while lengthening the wavelength in the first half of a cycle and generation of 15 pulses while shortening the wavelength in the second half of the cycle are repeated. The number of irradiation pulses N is set to 30. The wavelength change as shown in FIG. 9 is hereinafter referred to as triangular-waveform wavelength change.

In the case of controlling the wavelength in a triangular waveform as shown in FIG. 9, the wavelength shift amount δλ is calculated by the following equation.

$$\delta\lambda = (\lambda L - \lambda S)/(N/2-1)$$

When the number of irradiation pulses N is 30 (N=30), the wavelength shift amount δλ is a value obtained by dividing the difference between the shortest wavelength λS and the longest wavelength λL by 14.

In the sawtooth-waveform wavelength change shown in FIG. 7, it is necessary to rapidly change the wavelength before the 31st (n=1) pulse is output after the 30th (n=30) pulse is output, whereas in the triangular-waveform wavelength change shown in FIG. 9, it is less necessary to rapidly change the wavelength.

FIG. 10 shows the moving integrated spectrum waveform of 30 pulses in the wavelength change shown in FIG. 9. The moving integrated spectrum shown in FIG. 10 includes a plurality of peaks between the shortest wavelength λS and the longest wavelength λL. In FIG. 10, 15 peaks appear. In the triangular-waveform wavelength change, the wavelength difference between the peaks in the moving integrated spectrum waveform is the same as the wavelength shift amount δλ. In the wavelength change shown in FIG. 9 as well, the moving integrated spectrum waveform of 30 pulses is the same regardless of starting from any pulse.

In each wavelength change in FIGS. 7 and 9, a plurality of steep peaks separated from each other appear in the moving integrated spectrum waveforms shown in FIGS. 8 and 10, which may not be a preferable flat top shape. In this case, in the exposure apparatus 200, images are formed at discrete positions in the direction of the optical path axis of the pulse laser light, and there is a possibility that stable exposure performance cannot be obtained.

1.5.3 Triangular-Waveform Wavelength Change in Which Wavelengths are Shifted Between First Half and Second Half of Cycle FIG. 11 is a graph showing a third example of periodic wavelength change in the comparative example. In the example shown in FIG. 11, the wavelengths are shifted from each other so that, in one cycle, a pair of pulses having the same wavelength are not generated between the respective 15 pulses in the first half from the first (n=1) to 15th (n=15) and the respective 15 pulses in the second half from the 16th (n=16) to 30th (n=30). Specifically, in one cycle, when the wavelength shift amount for each pulse of the 15 pulses of the first half is $\delta\lambda_1$, the 15 pulses from the 30th (n=30) to 16th (n=16) have wavelength difference of $\delta\lambda_1/2$ with respect to the 15 pulses from the first (n=1) to 15th (n=15), respectively. The number of irradiation pulses N is 30.

In the case of controlling the wavelength in the triangular waveform in which wavelengths are shifted between the first half and the second half of the cycle as shown in FIG. 11, the wavelength shift amount $\delta\lambda_1$ is calculated by the following equation.

$$\delta\lambda_1 = (\lambda L - \lambda S)/((N-1)/2)$$

Here, since the wavelengths are shifted when the first (n=1) and N/2+1th (n=N/2+1) pulses are output, the wavelength shift amount $\delta\lambda_2$ is calculated by the following equation.

$$\delta\lambda_2 = \delta\lambda_1/2 = (\lambda L - \lambda S)/(N-1)$$

The moving integrated spectrum waveform in this case may have a shape close to a preferable flat top shape because the valleys of the peaks corresponding to the pulses in the first half of the cycle is filled with the peaks corresponding to the pulses in the second half of the cycle.

1.6 Problem of Comparative Example

However, even in the wavelength change shown in FIG. 11, as the difference λL−λS between the shortest wavelength λS and the longest wavelength λL increases, the moving integrated spectrum waveform may not be a preferable flat top shape.

FIG. 12 shows the moving integrated spectrum waveform of 30 pulses in the wavelength change shown in FIG. 11. When the interval between the peaks corresponding to the pulses in the first half of the cycle becomes wide, the valleys cannot be filled with the peaks corresponding to the pulses in the second half of the cycle. In FIG. 12, the peaks corresponding to the pulses in the first half of the cycle and the peaks corresponding to the pulses in the second half of the cycle appear separately. That is, 30 peaks appear in FIG. 12. The wavelength difference between the peaks in the moving integrated spectrum waveform is half of the wavelength shift amount $\delta\lambda_1$.

In the embodiments described below, by controlling the spectral line width Δλ of the pulse laser light, the moving integrated spectrum waveform is brought close to a preferred flat top shape.

2. Laser Device 100a Which Brings Moving Integrated Spectrum Waveform Close to Preferred Flat Top Shape by Controlling Spectral Line Width Δλ

2.1 Configuration

Figure 13:
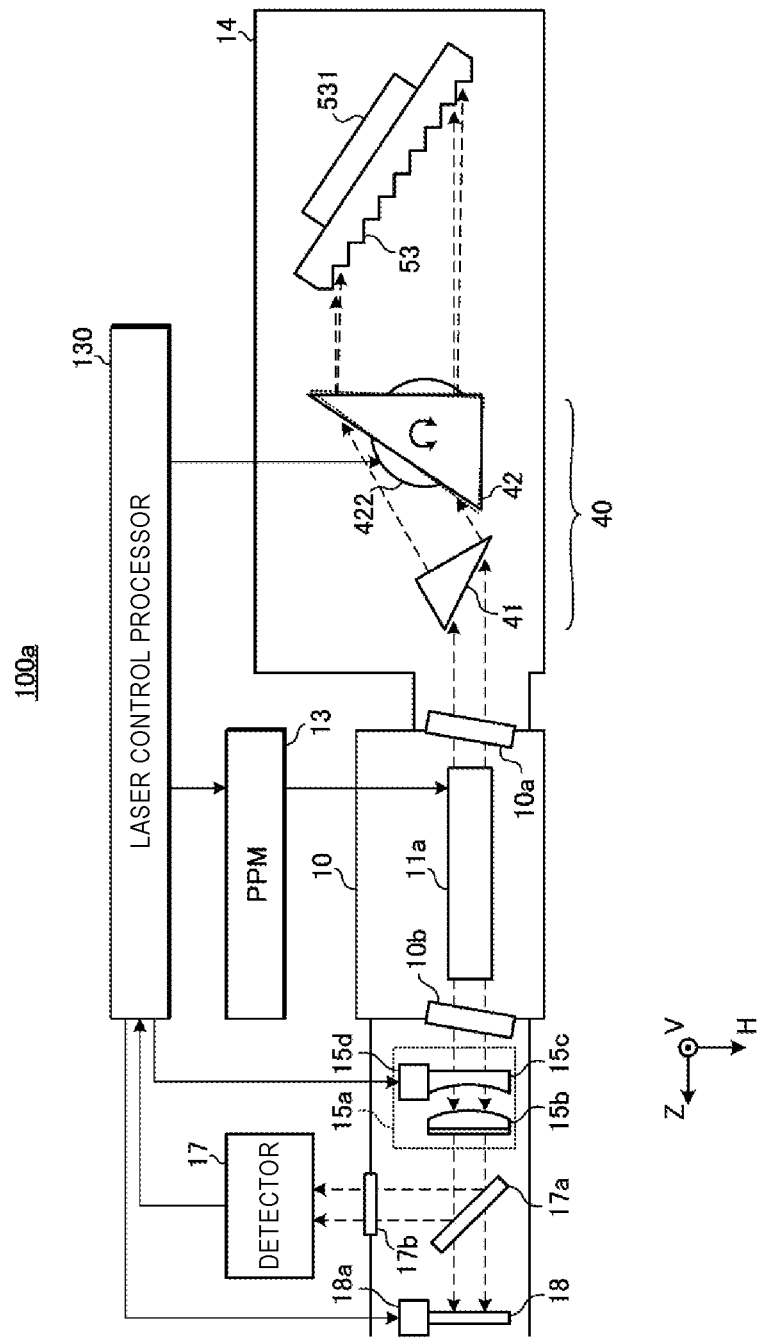
FIG. 13 schematically shows the configuration of the laser device according to a first embodiment.
Figure 14:
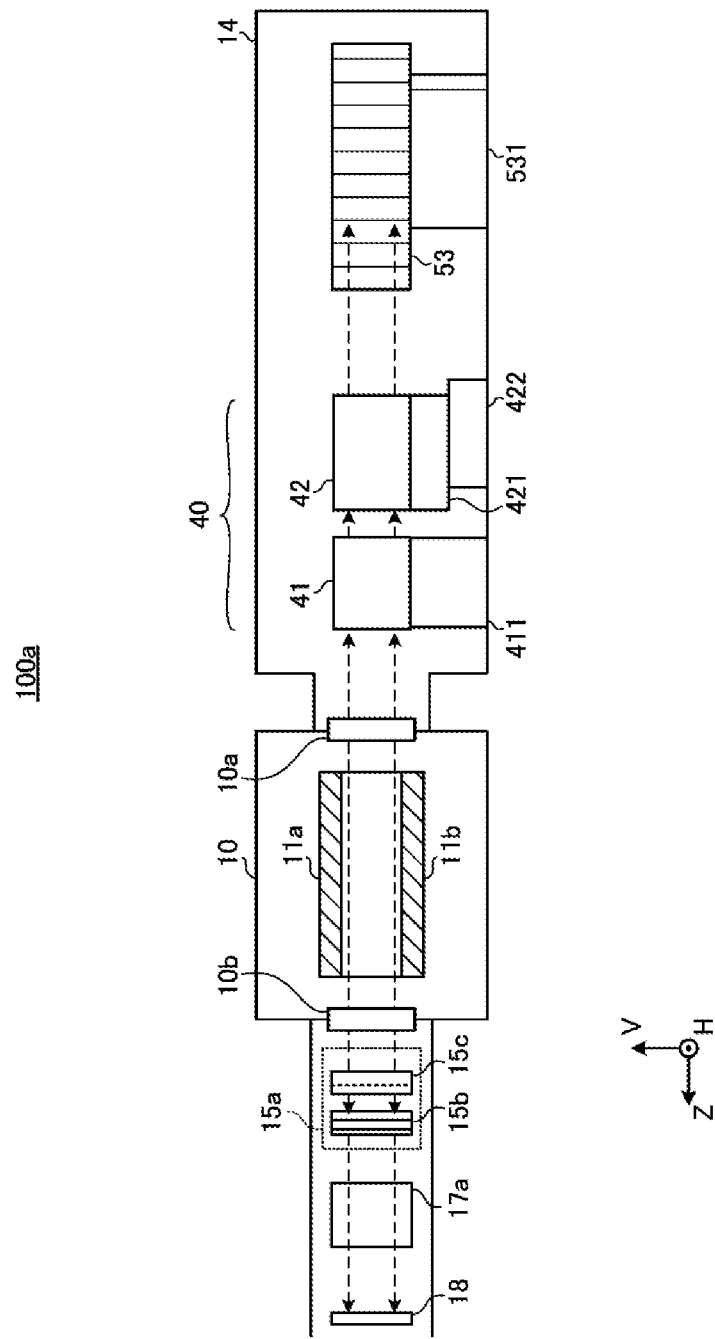
FIG. 14 schematically shows the configuration of the laser device according to the first embodiment.

FIGS. 13 and 14 schematically show the configuration of a laser device 100a according to a first embodiment. FIG. 13 corresponds to the laser device 100a viewed from the same direction as FIG. 2 in the comparative example, and FIG. 14 corresponds to the laser device 100a viewed from the same direction as FIG. 3 in the comparative example.

The laser device 100a includes a wavefront adjuster 15a which transmits a part of the light in place of the output coupling mirror 15. The laser device 100a further includes a detector 17 and a shutter 18.

The wavefront adjuster 15a includes a cylindrical plano-convex lens 15b, a cylindrical plano-concave lens 15c, and a linear stage 15d. The cylindrical plano-concave lens 15c is located between the laser chamber 10 and the cylindrical plano-convex lens 15b. The cylindrical plano-convex lens 15b and the cylindrical plano-concave lens 15c are arranged such that the convex surface of the cylindrical plano-convex lens 15b and the concave surface of the cylindrical plano-concave lens 15c face each other. The convex surface of the cylindrical plano-convex lens 15b and the concave surface of the cylindrical plano-concave lens 15c each have a focal axis that is parallel to the V axis. The planar surface of the cylindrical plano-convex lens 15b opposite to the convex surface is coated with a partial reflection film. The wavefront adjuster 15a and the line narrowing device 14 configure an optical resonator.

A beam splitter 17a is arranged on the optical path of the pulse laser light transmitted and output through the wavefront adjuster 15a. The beam splitter 17a transmits part of the pulse laser light with high transmittance and reflects the other part. The detector 17 is arranged on the optical path of the pulse laser light reflected by the beam splitter 17a. A window 17b may be arranged between the beam splitter 17a and the detector 17.

The shutter 18 can be arranged on the optical path of the pulse laser light transmitted through the beam splitter 17a.

2.2 Operation

The linear stage 15d moves the cylindrical plano-concave lens 15c along the optical path between the laser chamber 10 and the cylindrical plano-convex lens 15b. Thus, the wavefront of the light from the wavefront adjuster 15a to the line narrowing device 14 is adjusted. By adjusting the wavefront, the spectral line width $\Delta\lambda$ of the pulse laser light is adjusted. The wavefront adjuster 15a corresponds to the second actuator in the present disclosure.

The detector 17 acquires the measurement data of the spectral line width $\Delta\lambda$ of the pulse laser light. The detector 17 may further acquire the measurement data of the wavelength and the pulse energy of the pulse laser light. The detector 17 transmits the measurement data to the laser control processor 130.

Due to being taken in and out of the optical path of the pulse laser light by the driving unit 18a, the shutter 18 is switched between a first state in which the pulse laser light is blocked and a second state in which the pulse laser light passes toward the exposure apparatus 200. The first state of the shutter 18 is referred to as "closing the shutter 18", and the second state of the shutter 18 is referred to as "opening the shutter 18."

The spectral line width control and the wavelength control by the laser control processor 130 will be described later with reference to FIGS. 22 to 25.

2.3 Example of Optical System Which Changes Spectral Line Width $\Delta\lambda$

2.3.1 Wavefront Adjuster 15e Arranged Between Output Coupling Mirror 15 and Laser Chamber 10

Figure 15:
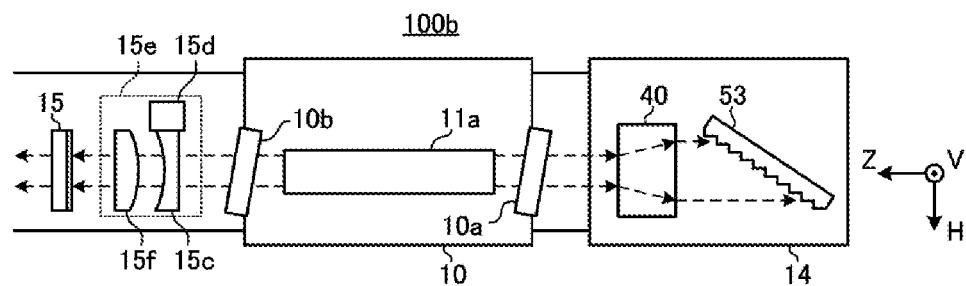
FIG. 15 shows the laser device including a first variation of an optical system which changes a spectral line width.

FIG. 15 shows a laser device 100b including a first variation of an optical system which changes the spectral line width $\Delta\lambda$. FIG. 15 corresponds to a view of the laser device 100b viewed from the same direction as FIG. 13, but some components are simplified or omitted.

In FIG. 15, a wavefront adjuster 15e is arranged between the output coupling mirror 15 and the laser chamber 10. The wavefront adjuster 15e corresponds to the second actuator in the present disclosure. The wavefront adjuster 15e includes, in place of the cylindrical plano-convex lens 15b, a cylindrical plano-convex lens 15f that does not include a partial reflection film. The cylindrical plano-convex lens 15f transmits the light output from the laser chamber 10 with high transmittance and causes the light to be incident on the output coupling mirror 15. The output coupling mirror 15 and the line narrowing device 14 configure an optical resonator.

2.3.2 Wavefront Adjuster 15h Configured of Deformable Mirror

Figure 16:
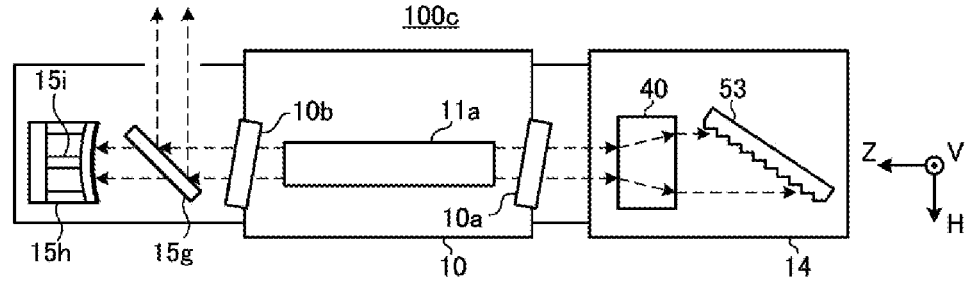
FIG. 16 shows the laser device including a second variation of the optical system which changes the spectral line width.

FIG. 16 shows a laser device 100c including a second variation of the optical system which changes the spectral line width $\Delta\lambda$. FIG. 16 corresponds to a view of the laser device 100c viewed from the same direction as FIG. 13, but some components are simplified or omitted.

In FIG. 16, the wavefront adjuster 15h is configured of a deformable mirror with high reflectance. The wavefront adjuster 15h corresponds to the second actuator in the present disclosure. The deformable mirror is a mirror capable of changing the curvature of the reflection surface due to expansion and contraction of an expansion-contraction portion 15i. The reflection surface of the deformable mirror is a cylindrical surface, and the focal axis of the reflection surface is parallel to the V axis. The wavefront adjuster 15h and the line narrowing device 14 configure an optical resonator.

A beam splitter 15g as an output coupling mirror is arranged on the optical path between the wavefront adjuster 15h and the laser chamber 10. The beam splitter 15g transmits part of the light output from the window 10b, thereby allowing the light to reciprocate between the wavefront adjuster 15h and the line narrowing device 14. The beam splitter 15g reflects the other part of the light output from the window 10b and outputs the reflected light toward the exposure apparatus 200 as the pulse laser light.

2.3.3 Wavefront Adjuster 15e Arranged Between Line Narrowing Device 14 and Laser Chamber 10

Figure 17:
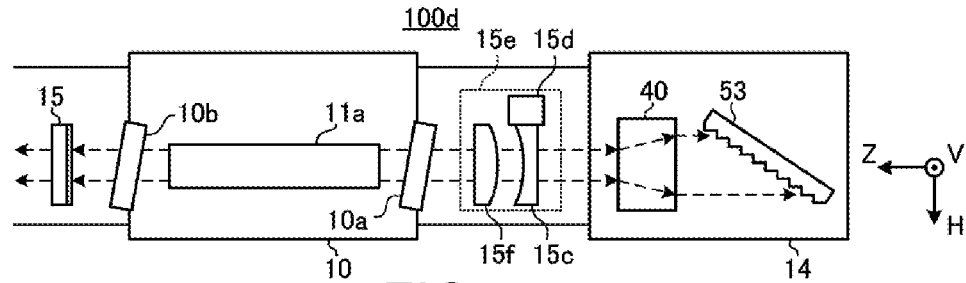
FIG. 17 shows the laser device including a third variation of the optical system which changes the spectral line width.

FIG. 17 shows a laser device 100d including a third variation of the optical system which changes the spectral line width $\Delta\lambda$. FIG. 17 corresponds to a view of the laser device 100d viewed from the same direction as FIG. 13, but some components are simplified or omitted.

In FIG. 17, a wavefront adjuster 15e is arranged between the line narrowing device 14 and the laser chamber 10. The configuration of the wavefront adjuster 15e is similar to that described with reference to FIG. 15. The output coupling mirror 15 and the line narrowing device 14 configure an optical resonator.

2.3.4 Grating 53a Capable of Changing Shape Thereof

Figure 18:
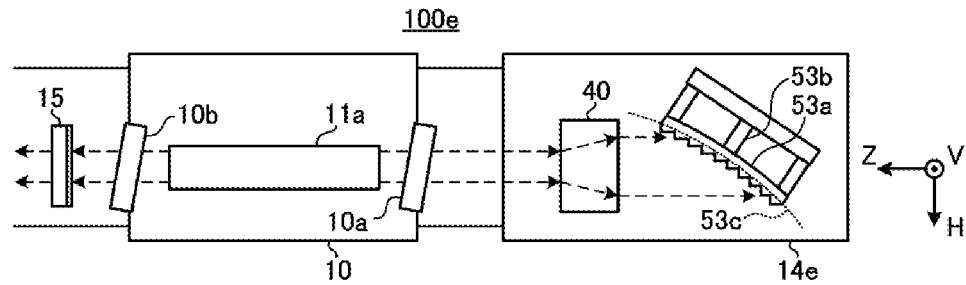
FIG. 18 shows the laser device including a fourth variation of the optical system which changes the spectral line width.

FIG. 18 shows a laser device 100e including a fourth variation of the optical system which changes the spectral line width $\Delta\lambda$. FIG. 18 corresponds to a view of the laser device 100e viewed from the same direction as FIG. 13, but some components are simplified or omitted.

The laser device 100e includes a line narrowing device 14e, and the line narrowing device 14e includes a grating 53a. The curvature of an envelope surface 53c of grooves of the grating 53a is to be changeable by the expansion and contraction of an expansion-contraction portion 53b. The envelope surface 53c of the grooves of the grating 53a is a cylindrical surface, and the focal axis of the envelope surface 53c is parallel to the V axis. The output coupling mirror 15 and the line narrowing device 14e configure an optical resonator. The spectral line width Δλ of the pulse laser light is changed by changing the curvature of the envelope surface 53c of the grooves of the grating 53a. The grating 53a corresponds to the second actuator in the present disclosure.

Figure 19:
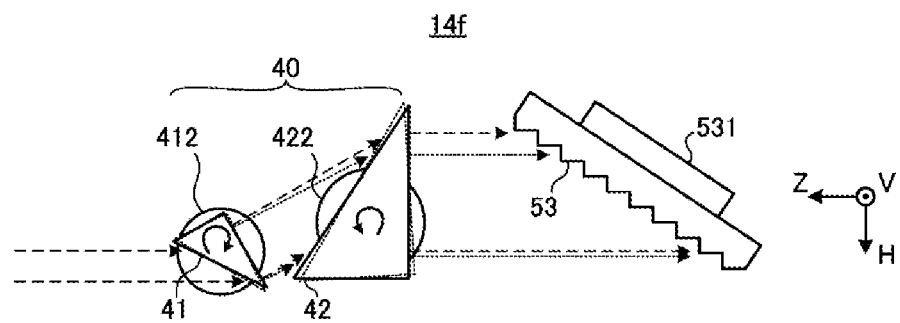
FIG. 19 shows a line narrowing device including a fifth variation of the optical system which changes the spectral line width.

2.3.5 First and Second Prisms 41, 42 Which Change Beam Expansion Rate by Rotating in Opposite Directions to Each Other FIG. 19 shows a line narrowing device 14f including a fifth variation of the optical system which changes the spectral line width Δλ.

A first prism 41 is rotatable about an axis parallel to the V axis by a rotation stage 412. In FIG. 2, the incident angle of the light on the grating 53 is changed to change the selected wavelength by rotating a second prism 42, whereas in FIG. 19, the first and second prisms 41, 42 are rotated in opposite directions to each other. When the first and second prisms 41, 42 are rotated in opposite directions to each other, the incident angle of the light on the grating 53 does not change significantly, but the beam expansion rate of the light due to the first and second prisms 41, 42 changes. Therefore, the wavelength of the pulse laser light does not change significantly, but the spectral line width Δλ of the pulse laser light changes.

By adjusting each of the rotation angles of the first and second prisms 41, 42, it is also possible to change both the incident angle of the light on the grating 53 and the beam expansion rate of the light due to the first and second prisms 41, 42. Thus, both the wavelength and the spectral line width Δλ of the pulse laser light can be changed. The rotation stages 412, 422 configure both the first actuator and the second actuator in the present disclosure. A laser device including such a line narrowing device 14f also corresponds to the laser device including the first actuator and the second actuator in the present disclosure.

2.3.6 Prism 47 Which Changes Beam Expansion Rate by Replacement

Figure 20:
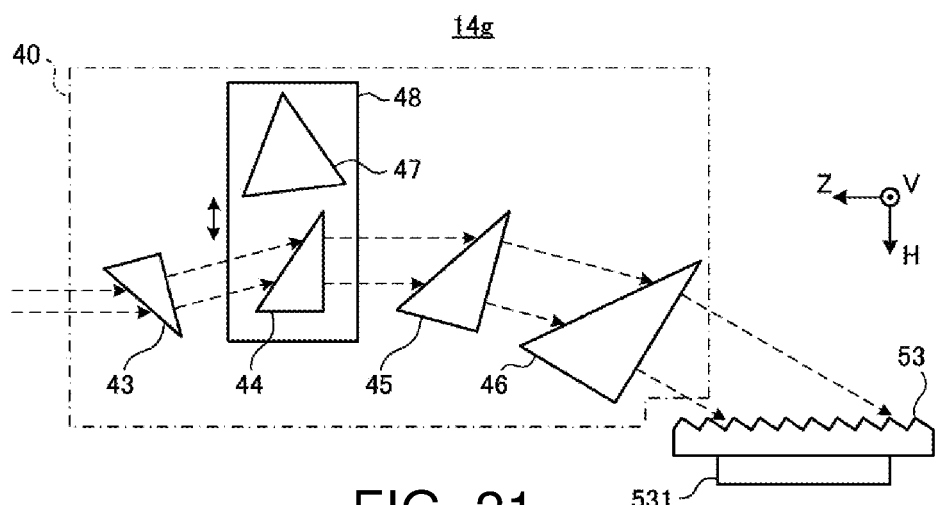
FIG. 20 shows the line narrowing device including a sixth variation of the optical system which changes the spectral line width.
Figure 21:
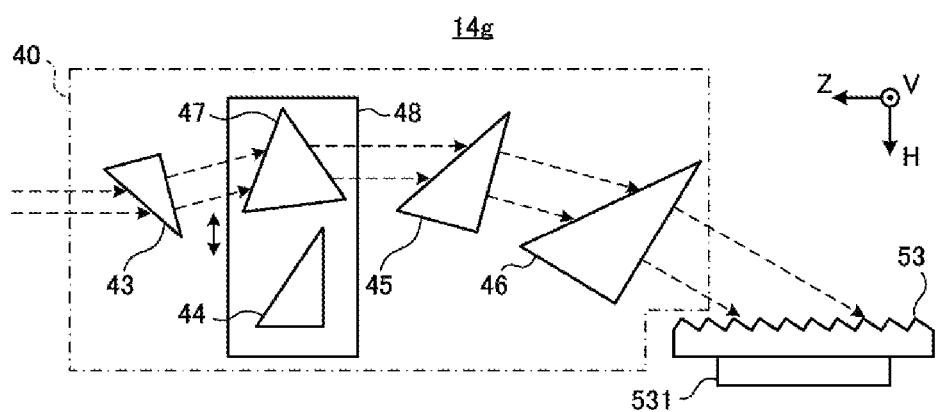
FIG. 21 shows the line narrowing device including the sixth variation of the optical system which changes the spectral line width.

FIGS. 20 and 21 show a line narrowing device 14g including a sixth variation of the optical system which changes the spectral line width Δλ. The line narrowing device 14g includes prisms 43 to 47.

As shown in FIG. 20, the prisms 43, 44, 45, 46 are arranged in this order from the laser chamber 10 side toward the grating 53. The prism 44 changes both the beam width and the travel direction of the light incident from the prism 43 and causes the light to be incident on the prism 45.

The prism 44 and the prism 47 are arranged on a uniaxial stage 48. As shown in FIG. 21, the prism 47 can be arranged on the optical path of the optical resonator in place of the prism 44. Similarly to the prism 44, the prism 47 changes the travel direction of the light incident from the prism 43 and causes the light to be incident on the prism 45. However, the prism 47 is different from the prism 44 in the expansion rate of the beam width. For example, the prism 47 may cause the light incident from the prism 43 to be incident on the prism 45 without expanding the beam width of the light.

By replacing the prism 47 and the prism 44, the incident angle of the light incident on the grating 53 from the prism 46 does not change significantly, but the beam width of the light incident on the grating 53 from the prism 46 changes. That is, the expansion rate of the beam width of the beam expander 40 changes. Therefore, before and after the replacement of the prism 47 and the prism 44, the wavelength of the pulse laser light does not change significantly, but the spectral line width Δλ of the pulse laser light changes. The uniaxial stage 48 corresponds to the second actuator in the present disclosure.

2.4 Spectral Line Width Control and Wavelength Control by Laser Control Processor 130

Figure 22:
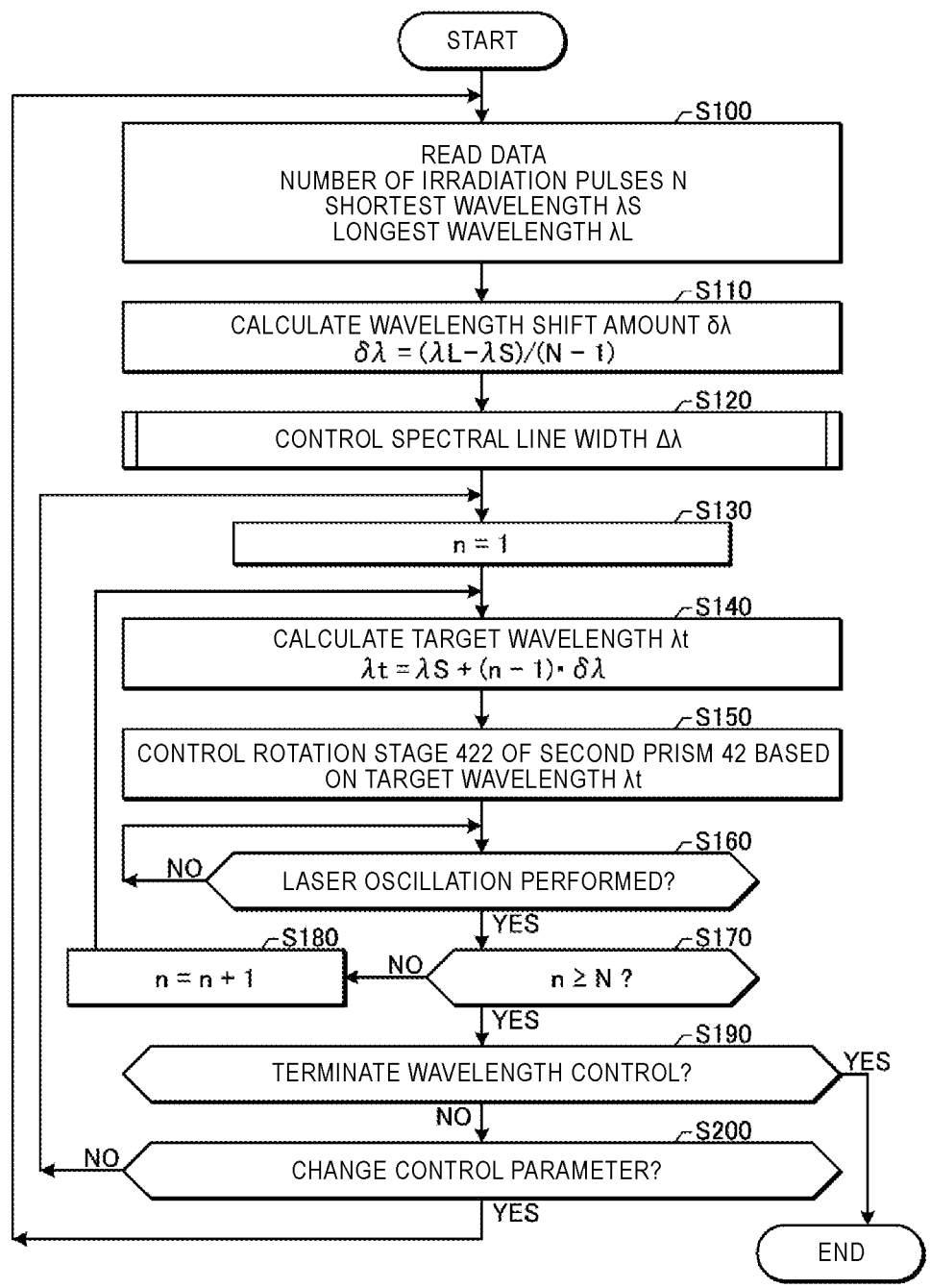
FIG. 22 is a flowchart showing a processing procedure of spectral line width control and wavelength control by the laser control processor.

FIG. 22 is a flowchart showing a processing procedure of spectral line width control and wavelength control by the laser control processor 130. FIG. 22 and FIGS. 23 to 25 described later exemplify the processes in the case in which the wavelength is controlled in the sawtooth waveform as shown in FIG. 7.

In S100, the laser control processor 130 reads data of control parameters received from the exposure control processor 210. The data read by the laser control processor 130 includes the number of irradiation pulses N with which one location of the irradiation receiving object is irradiated, and the combination of the shortest wavelength λS and the longest wavelength λL. The combination of the shortest wavelength λS and the longest wavelength λL is an example of data specifying the difference λL−λS between the shortest wavelength λS and the longest wavelength λL in the present disclosure.

Alternatively, the laser control processor 130 may read any of the combination of the shortest wavelength λS and the difference λL−λS, the combination of the longest wavelength λL and the difference λL−λS, and the combination of the average wavelength (λS+λL)/2 and the difference λL−λS, instead of the combination of the shortest wavelength λS and the longest wavelength λL.

In S110, the laser control processor 130 calculates the wavelength shift amount δλ by the following equation.

$$\delta\lambda=(\lambda L-\lambda S)/(N-1)$$

In S120, the laser control processor 130 controls the spectral line width Δλ. Details of S120 will be described later with reference to FIGS. 23 to 25.

S130 to S200 are processes of controlling the rotation stage 422 so that the oscillation wavelength periodically changes every number of irradiation pulses N between the shortest wavelength λS and the longest wavelength λL. In S130, the laser control processor 130 sets the value of the pulse number n to 1.

In S140, the laser control processor 130 calculates a target wavelength λt by the following equation.

$$\lambda t=\lambda S+(n-1)*\delta\lambda$$

The target wavelength λt has the same value as the shortest wavelength λS when the pulse number n is 1, and the wavelength shift amount δλ is added to the target wavelength λt each time the value of the pulse number n increases by 1.

In S150, the laser control processor 130 controls the rotation stage 422 based on the target wavelength λt. By controlling the rotation stage 422, the second prism 42 is rotated and the selected wavelength by the line narrowing device 14 is changed.

In S160, the laser control processor 130 determines whether or not laser oscillation has been performed. Whether or not laser oscillation has been performed is determined based on data received from the detector 17. Alternatively, it may be determined by whether or not an oscillation trigger signal has been transmitted to the pulse power module 13.

In S170, the laser control processor 130 determines whether or not the value of the pulse number n is equal to or more than the number of irradiation pulses N. When the value of the pulse number n is less than the number of irradiation pulses N (S170:NO), the laser control processor 130 advances processing to S180. When the value of the pulse number n is equal to or more then the number of irradiation pulses N (S170:YES), the laser control processor 130 advances processing to S190.

In S180, the laser control processor 130 updates the value of the pulse number n by adding 1 to the value of n. After S180, the laser control processor 130 returns processing to S140.

In S190, the laser control processor 130 determines whether or not to terminate the wavelength control. When the wavelength control is not to be terminated (S190:NO), the laser control processor 130 returns processing to S200. When the wavelength control is to be terminated (S190:YES), the laser control processor 130 ends processing of the present flowchart.

In S200, the laser control processor 130 determines whether or not to change the control parameters. When the control parameters are not to be changed (S200:NO), the laser control processor 130 returns processing to S130. By returning the pulse number n to 1 in S130 and repeating the above-described operation, the wavelength changes in the sawtooth waveform. When the control parameters are to be changed (S200:YES), the laser control processor 130 returns processing to S100.

2.5 Control of Spectral Line Width $\Delta\lambda$

Figure 23:
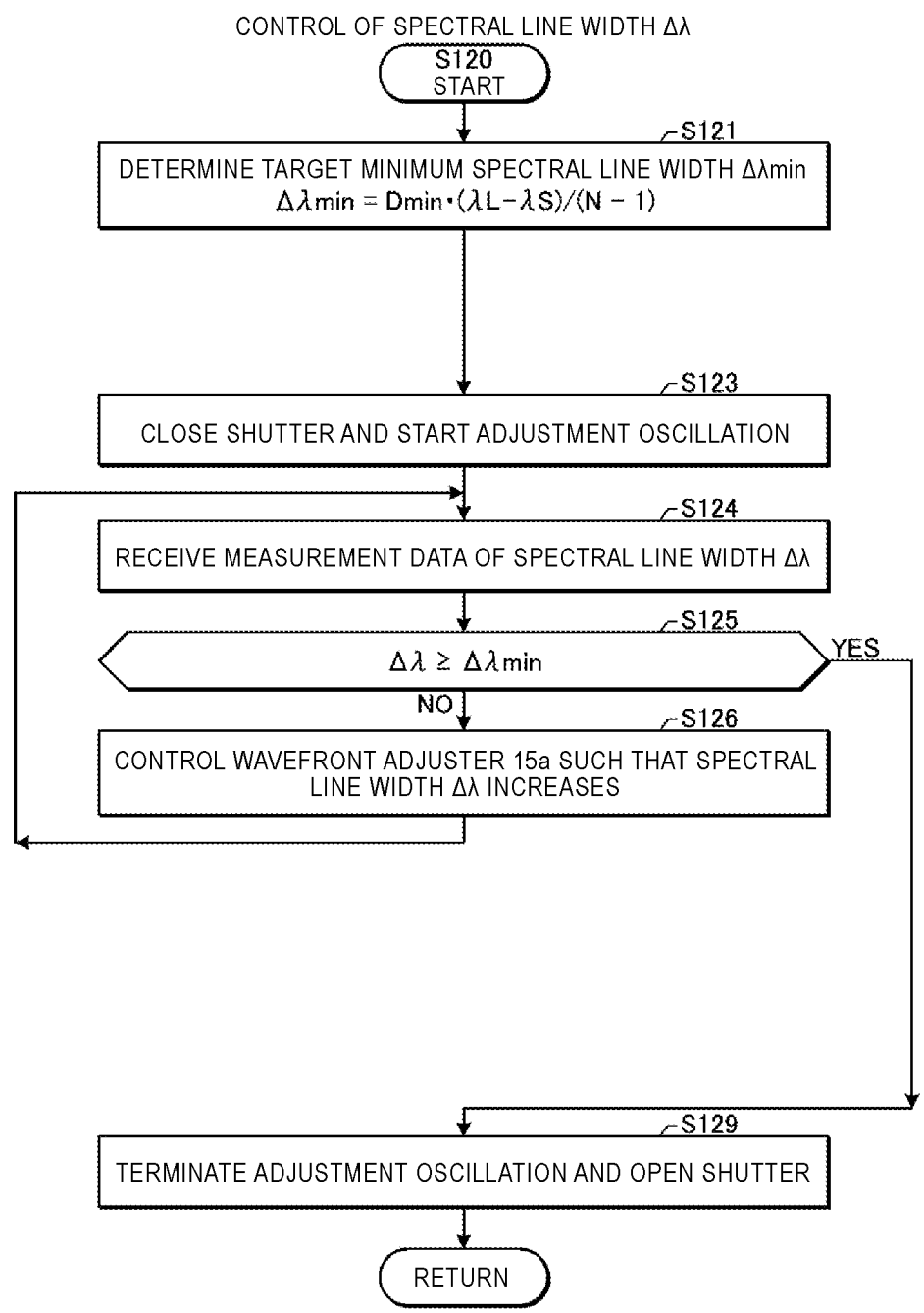
FIG. 23 is a flowchart showing the processing procedure of the control of the spectral line width in the first embodiment.

FIG. 23 is a flowchart showing the processing procedure of the control of the spectral line width $\Delta\lambda$ in the first embodiment. The processing shown in FIG. 23 corresponds to the subroutine of S120 in FIG. 22.

In S121, the laser control processor 130 determines a target minimum spectral line width $\Delta\lambda$min to be a value calculated by the following equation. The target minimum spectral line width $\Delta\lambda$min is a lower limit value of the spectral line width control, and is an example of the target spectral line width in the present disclosure.

$$\Delta\lambda\text{min}=D\text{min}*(\lambda L-\lambda S)/(N-1)$$

Here, Dmin is a coefficient and is preferably 1 or more.

The range of Dmin will be described later with reference to FIGS. 34, 35, 44 and the like. The target minimum spectral line width $\Delta\lambda$min corresponds to a value obtained by multiplying the wavelength difference $(\lambda L-\lambda S)/(N-1)$ between the peaks in the moving integrated spectrum waveform by the coefficient Dmin. Therefore, the target minimum spectral line width $\Delta\lambda$min is set such that the spectral line width $\Delta\lambda$ increases as the wavelength difference $(\lambda L-\lambda S)/(N-1)$ between the peaks increases. In FIG. 23, an upper limit value of the spectral line width control may not be set.

FIG. 23 shows a process in the case of controlling the wavelength in the sawtooth waveform, but in the case of controlling the wavelength in the triangular waveform as shown in FIG. 9, the target minimum spectral line width $\Delta\lambda$min is calculated by the following equation.

$$\Delta\lambda\text{min}=D\text{min}*(\lambda L-\lambda S)/(N/2-1)$$

The target minimum spectral line width $\Delta\lambda$min corresponds to a value obtained by multiplying the wavelength difference $(\lambda L-\lambda S)/(N/2-1)$ between the peaks in the moving integrated spectrum waveform by the coefficient Dmin. Therefore, the target minimum spectral line width $\Delta\lambda$min is set such that the spectral line width $\Delta\lambda$ increases as the wavelength difference $(\lambda L-\lambda S)/(N/2-1)$ between the peaks increases.

In the case of controlling the wavelength in the triangular waveform in which wavelengths are shifted between the first half and the second half of the cycle as shown in FIG. 11, the target minimum spectral line width $\Delta\lambda$min is calculated by the following equation.

$$\Delta\lambda\text{min}=D\text{min}*(\lambda L-\lambda S)/(N-1)$$

The target minimum spectral line width $\Delta\lambda$min corresponds to a value obtained by multiplying the wavelength difference $(\lambda L-\lambda S)/(N-1)$ between the peaks in the moving integrated spectrum waveform by the coefficient Dmin.

By determining the target spectral line width in this manner, the target spectral line width in a case in which the difference $\lambda L-\lambda S$ between the shortest wavelength $\lambda S$ and the longest wavelength $\lambda L$ is a third value which is more than a first value and the number of irradiation pulses N is a fourth value which is equal to or less than a second value is larger than that in a case in which the difference $\lambda L-\lambda S$ is the first value and the number of irradiation pulses N is the second value. Alternatively, the target spectral line width in a case in which the difference $\lambda L-\lambda S$ between the shortest wavelength $\lambda S$ and the longest wavelength $\lambda L$ is a third value which is equal to or more than the first value and the number of irradiation pulses N is a fourth value which is less than the second value is larger than that in a case in which the difference $\lambda L-\lambda S$ is the first value and the number of irradiation pulses N is the second value.

After S121, in S123, the laser control processor 130 closes the shutter 18 to start adjustment oscillation. In S124, the laser control processor 130 receives measurement data of the spectral line width $\Delta\lambda$ from the detector 17 and calculates a measurement value of the spectral line width $\Delta\lambda$ from the measurement data.

In S125, the laser control processor 130 determines whether or not the measurement value of the spectral line width $\Delta\lambda$ is equal to or more than the target minimum spectral line width $\Delta\lambda$min.

When the measurement value of the spectral line width $\Delta\lambda$ is less than the target minimum spectral line width $\Delta\lambda$min (S125:NO), the laser control processor 130 advances processing to S126. In S126, the laser control processor 130 controls the wavefront adjuster 15a to increase the spectral line width $\Delta\lambda$. After S126, the laser control processor 130 returns processing to S124.

When the measurement value of the spectral line width $\Delta\lambda$ is equal to or more than the target minimum spectral line width $\Delta\lambda$min (S125:YES), the laser control processor 130 advances processing to S129. In S129, the laser control processor 130 terminates the adjustment oscillation and opens the shutter 18. After S129, the laser control processor 130 terminates the processing of the present flowchart and returns to processing shown in FIG. 22.

2.6 Effect

According to the first embodiment, the laser device 100a includes the rotation stage 422 for adjusting the oscillation wavelength of the pulse laser light, the wavefront adjuster 15a for adjusting the spectral line width $\Delta\lambda$ of the pulse laser light, and the laser control processor 130. The laser control processor 130 determines the target minimum spectral line width $\Delta\lambda$min by reading data specifying the number of irradiation pulses N of the pulse laser light with which one location of the irradiation receiving object is irradiated and the difference $\lambda L-\lambda S$ between the shortest wavelength $\lambda S$ and the longest wavelength $\lambda L$, controls the wavefront adjuster 15a based on the target minimum spectral line width Δλmin, and controls the rotation stage 422 so that the oscillation wavelength periodically changes every number of irradiation pulses N between the shortest wavelength λS and the longest wavelength λL. Accordingly, the spectral line width Δλ is controlled based on the number of irradiation pulses N and the difference λL−λS between the shortest wavelength λS and the longest wavelength λL, and a plurality of steep peaks in the moving integrated spectrum can be moderated.

According to the first embodiment, the laser device 100*a* further includes the shutter 18 arranged on the optical path of the pulse laser light. The laser control processor 130 determines the target minimum spectral line width Δλmin as the target spectral line width, closes the shutter 18, controls the wavefront adjuster 15*a* so that the spectral line width Δλ gradually increases, and opens the shutter 18 when the measurement value of the spectral line width Δλ becomes equal to or more than the target minimum spectral line width Δλmin. Accordingly, output of the pulse laser light to the exposure apparatus 200 is stopped until the pulse laser light having the target minimum spectral line width Δλmin or more is obtained, and when the pulse laser light having the target minimum spectral line width Δλmin or more can be output, output to the exposure apparatus 200 can be performed.

According to the first embodiment, the moving integrated spectrum waveform for every number of irradiation pulses N of the pulse laser light includes a plurality of peaks, and the laser control processor 130 determines the target minimum spectral line width Δλmin such that the spectral line width Δλ increases as the wavelength difference (λL−λS)/(N−1) between the peaks increases. Accordingly, the target minimum spectral line width Δλmin can be determined to be an appropriate value in accordance with the wavelength difference (λL−λS)/(N−1) between the peaks. In other respects, the first embodiment is similar to the comparative example.

3. Laser Device 100*a* in Which Target Maximum Spectral Line Width Δλmax is Set

3.1 Configuration and Operation

Figure 24:
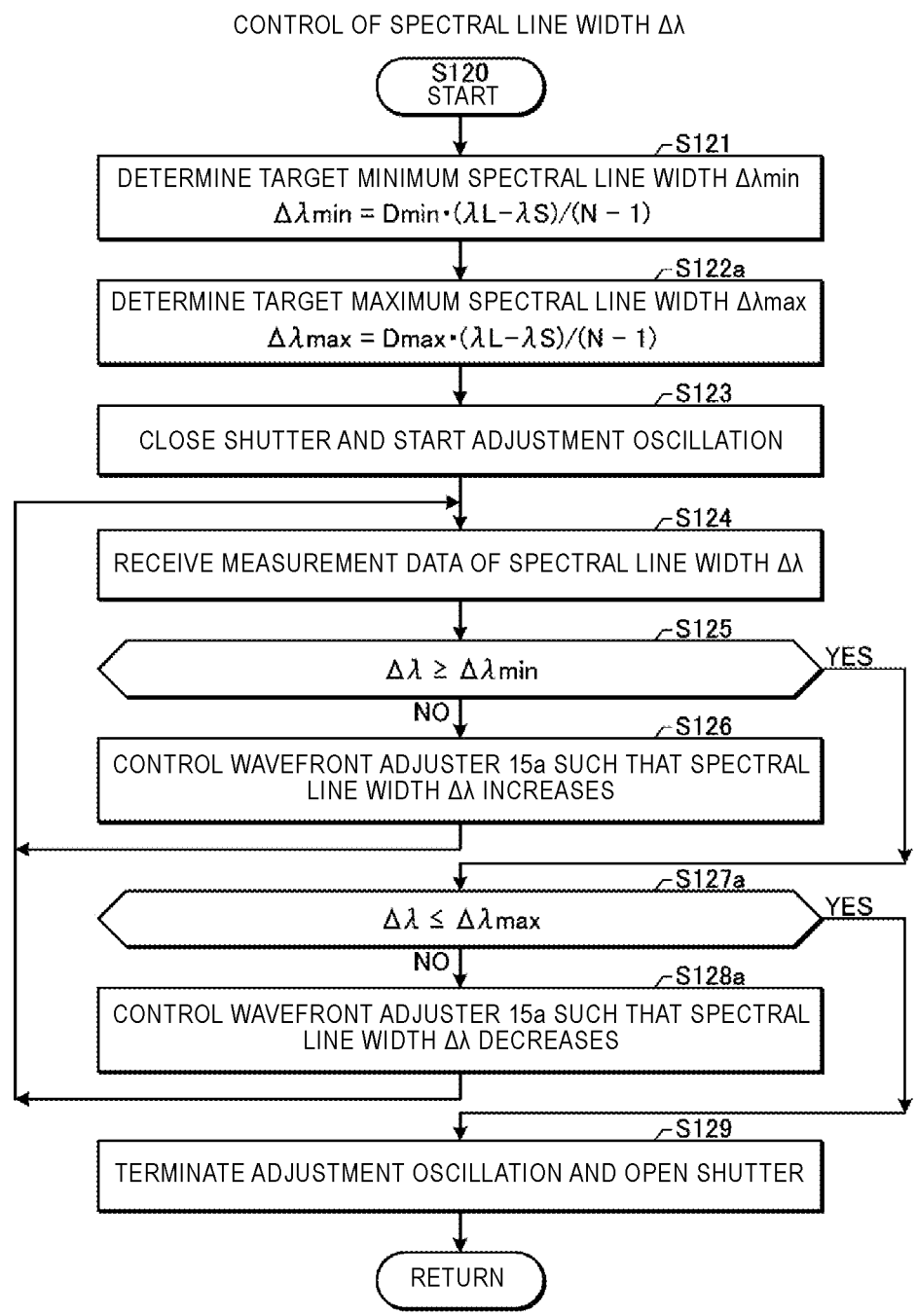
FIG. 24 is a flowchart showing the processing procedure of the control of the spectral line width in a second embodiment.

FIG. 24 is a flowchart showing the processing procedure of the control of the spectral line width Δλ in a second embodiment. The processing shown in FIG. 24 corresponds to the subroutine of S120 in FIG. 22. The configuration of the laser device 100*a* according to the second embodiment is similar to that of the first embodiment, and the operation of the laser device 100*a* according to the second embodiment is similar to that of the first embodiment except for the control of the spectral line width Δλ.

The process of S121 is similar to the corresponding process in the first embodiment. After S121, in S122*a*, the laser control processor 130 determines a target maximum spectral line width Δλmax to be a value calculated by the following equation. The target maximum spectral line width Δλmax is an upper limit value of the spectral line width control, and is an example of the target spectral line width in the present disclosure.

$$\Delta\lambda\text{max} = D\text{max} \cdot (\lambda - \lambda S)/(N-1)$$

Here, Dmax is a coefficient and is preferably 2.5 or less. The range of Dmax will be described later with reference to FIGS. 34, 35, 44 and the like. The target maximum spectral line width Δλmax corresponds to a value obtained by multiplying the wavelength difference (λL−λS)/(N−1) between the peaks in the moving integrated spectrum waveform by the coefficient Dmax. Therefore, the target maximum spectral line width Δλmax is set such that the spectral line width Δλ increases as the wavelength difference (λL−λS)/(N−1) between the peaks increases.

FIG. 24 shows a process in the case of controlling the wavelength in the sawtooth waveform, but in the case of controlling the wavelength in the triangular waveform as shown in FIG. 9, the target maximum spectral line width Δλmax is calculated by the following equation.

$$\Delta\lambda\text{max} = D\text{max} \cdot (\lambda L - \lambda S)/(N/2-1)$$

That is, the target maximum spectral line width Δλmax is set such that the spectral line width Δλ increases as the wavelength difference (λL−λS)/(N/2−1) between the peaks increases.

In the case of controlling the wavelength in the triangular waveform in which wavelengths are shifted between the first half and the second half of the cycle as shown in FIG. 11, the target maximum spectral line width Δλmax is calculated by the following equation.

$$\Delta\lambda\text{max} = D\text{max} \cdot (\lambda L - \lambda S)/(N-1)$$

The processes of S123 to S126 after S122*a* are similar to the corresponding processes in the first embodiment.

When the determination in S125 is YES, the laser control processor 130 advances processing to S127*a*. In S127*a*, the laser control processor 130 determines whether or not the measurement value of the spectral line width Δλ is equal to or less than the target maximum spectral line width Δλmax.

When the measurement value of the spectral line width Δλ is more than the target maximum spectral line width Δλmax (S127*a*:NO), the laser control processor 130 advances processing to S128*a*. In S128*a*, the laser control processor 130 controls the wavefront adjuster 15*a* so that the spectral line width Δλ decreases. After S128*a*, the laser control processor 130 returns processing to S124.

When the measurement value of the spectral line width Δλ is equal to or less than the target maximum spectral line width Δλmax (S127*a*:YES), the laser control processor 130 advances processing to S129. The process of S129 is similar to the corresponding process in the first embodiment. After S129, the laser control processor 130 terminates the processing of the present flowchart and returns to processing shown in FIG. 22.

3.2 Effect

According to the second embodiment, the spectral line width can be controlled between the target minimum spectral line width Δλmin and the target maximum spectral line width Δλmax. In other respects, the second embodiment is similar to the first embodiment.

4. Laser Device 100*a* Which Controls Spectral Line Width Δλ into Allowable Range

4.1 Configuration and Operation

Figure 25:
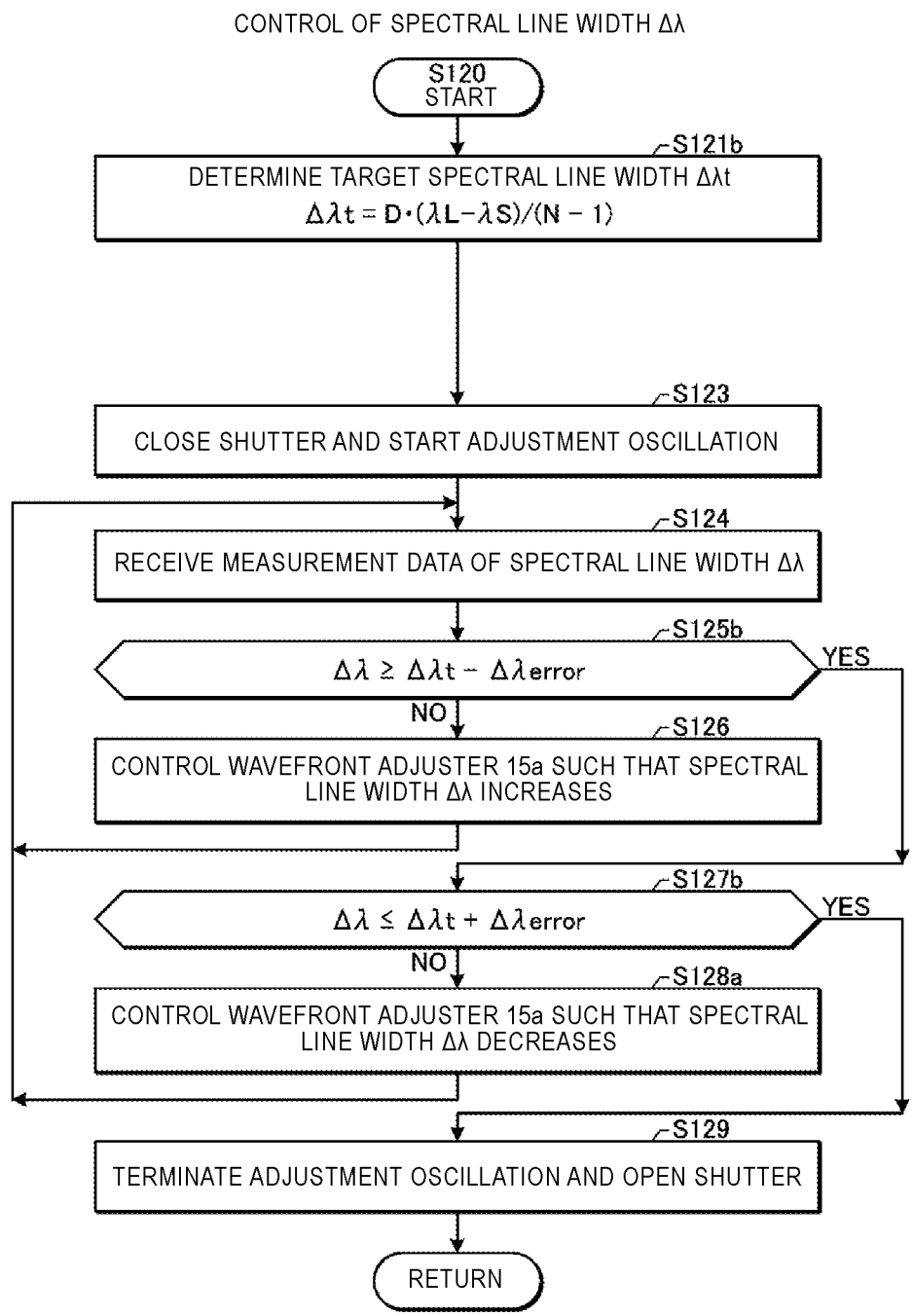
FIG. 25 is a flowchart showing the processing procedure of the control of the spectral line width in a third embodiment.

FIG. 25 is a flowchart showing the processing procedure of the control of the spectral line width Δλ in a third embodiment. The processing shown in FIG. 25 corresponds to the subroutine of S120 in FIG. 22. The configuration of the laser device 100*a* according to the third embodiment is similar to that of the first embodiment, and the operation of the laser device 100*a* according to the third embodiment is similar to that of the first embodiment except for the control of the spectral line width Δλ.

In S121b, the laser control processor 130 determines a target spectral line width $\Delta\lambda t$ to be a value calculated by the following equation.

$$\Delta\lambda t = D*(\lambda L - \lambda S)/(N-1)$$

Here, D is a coefficient and is preferably 1 or more and 2.5 or less. The range of D will be described later with reference to FIGS. 34, 35, 44 and the like. The target spectral line width $\Delta\lambda t$ corresponds to a value obtained by multiplying the wavelength difference $(\lambda L - \lambda S)/(N-1)$ between the peaks in the moving integrated spectrum waveform by the coefficient D. Therefore, the target spectral line width $\Delta\lambda t$ is set such that the spectral line width $\Delta\lambda$ increases as the wavelength difference $(\lambda L - \lambda S)/(N-1)$ between the peaks increases.

FIG. 25 shows a process in the case of controlling the wavelength in the sawtooth waveform, but in the case of controlling the wavelength in the triangular waveform as shown in FIG. 9, the target spectral line width $\Delta\lambda t$ is calculated by the following equation.

$$\Delta\lambda t = D*(\lambda L - \lambda S)/(N/2-1)$$

That is, the target spectral line width $\Delta\lambda t$ is set such that the spectral line width $\Delta\lambda$ increases as the wavelength difference $(\lambda L - \lambda S)/(N/2-1)$ between the peaks increases.

In the case of controlling the wavelength in the triangular waveform in which wavelengths are shifted between the first half and the second half of the cycle as shown in FIG. 11, the target spectral line width $\Delta\lambda t$ is calculated by the following equation.

$$\Delta\lambda t = D*(\lambda L - \lambda S)/(N-1)$$

The processes of S123 and S124 after S121b are similar to the corresponding processes in the first embodiment. After S124, in S125b, the laser control processor 130 determines whether or not the measurement value of the spectral line width $\Delta\lambda$ is equal to or more than a lower limit value of the allowable range by the following equation.

$$\Delta\lambda \geq \Delta\lambda t - \Delta\lambda\text{error}$$

Here, $\Delta\lambda$error is an allowable error, and the lower limit value of the allowable range is obtained by subtracting the allowable error $\Delta\lambda$error from the target spectral line width $\Delta\lambda t$.

When the measurement value of the spectral line width $\Delta\lambda$ is less than the lower limit value of the allowable range (S125b:NO), the laser control processor 130 advances processing to S126. The process of S126 is similar to the corresponding process in the first embodiment. After S126, the laser control processor 130 returns processing to S124.

When the measurement value of the spectral line width $\Delta\lambda$ becomes equal to or more than the lower limit value of the allowable range (S125b:YES), the laser control processor 130 advances processing to S127b.

In S127b, the laser control processor 130 determines whether or not the measurement value of the spectral line width $\Delta\lambda$ is equal to or more than an upper limit value of the allowable range by the following equation.

$$\Delta\lambda \leq \Delta\lambda t + \Delta\lambda\text{error}$$

The upper limit value of the allowable range is obtained by adding the allowable error $\Delta\lambda$error to the target spectral line width $\Delta\lambda t$.

When the measurement value of the spectral line width $\Delta\lambda$ is more than the upper limit value of the allowable range (S127b:NO), the laser control processor 130 advances processing to S128a. In S128a, the laser control processor 130 controls the wavefront adjuster 15a so that the spectral line width $\Delta\lambda$ decreases. After S128a, the laser control processor 130 returns processing to S124.

When the measurement value of the spectral line width $\Delta\lambda$ is equal to or less than the upper limit value of the allowable range (S127b:YES), the laser control processor 130 advances processing to S129. The process of S129 is similar to the corresponding process in the first embodiment. After S129, the laser control processor 130 terminates the processing of the present flowchart and returns to processing shown in FIG. 22.

4.2 Effect

According to the third embodiment, the spectral line width $\Delta\lambda$ can be controlled into the allowable range defined by the allowable error $\Delta\lambda$error around the target spectral line width $\Delta\lambda t$. In other respects, the third embodiment is similar to the first embodiment.

5. Change of Moving Integrated Spectrum Waveform Due to Control of Spectral Line Width $\Delta\lambda$

5.1 Case in Which Wavelength is Controlled in Sawtooth Waveform

FIGS. 26 to 33 show the moving integrated spectrum waveform in the case in which the wavelength is controlled in the sawtooth waveform as shown in FIG. 7. In FIGS. 26 to 33, the horizontal axis represents the wavelength and the vertical axis represents the light intensity. In any of FIGS. 26 to 33, the number of irradiation pulses N is 30, and the wavelength difference between the shortest wavelength $\lambda S$ and the longest wavelength $\lambda L$ is 10 pm. The spectral line widths $\Delta\lambda$ in FIGS. 26 to 33 are different from each other. The spectral line width $\Delta\lambda$ is 0.2 pm in FIG. 26, 0.3 pm in FIG. 27, 0.4 pm in FIG. 28, 0.5 pm in FIG. 29, 0.6 pm in FIG. 30, 0.8 pm in FIG. 31, 1.0 pm in FIGS. 32, and 1.2 pm in FIG. 33.

The spectral line width $\Delta\lambda$ is the full width at half maximum.

Figure 26:
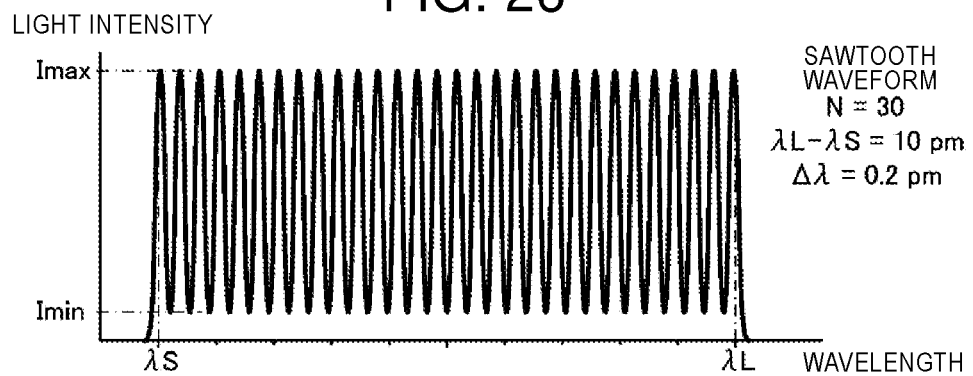
FIG. 26 shows the moving integrated spectrum waveform in a case in which the spectral line width is set to 0.2 pm and the wavelength is controlled in a sawtooth waveform as shown in FIG. 7.
Figure 27:
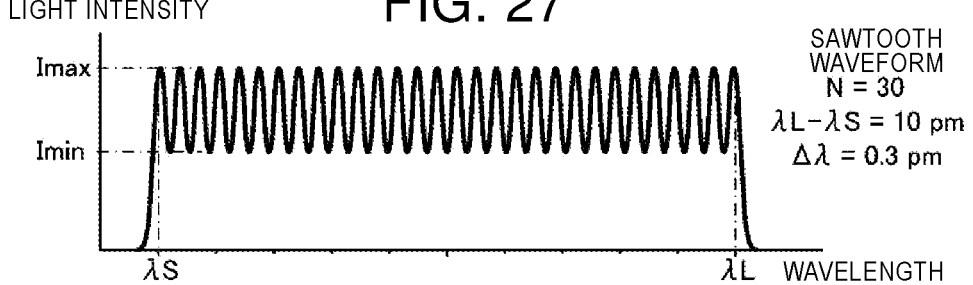
FIG. 27 shows the moving integrated spectrum waveform in a case in which the spectral line width is set to 0.3 pm and the wavelength is controlled in the sawtooth waveform as shown in FIG. 7.
Figure 28:
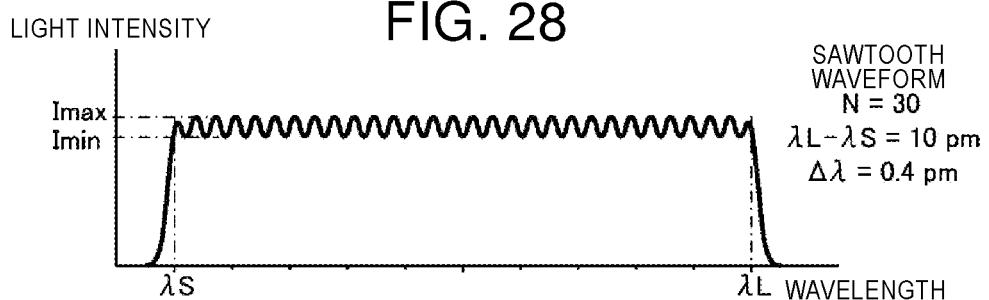
FIG. 28 shows the moving integrated spectrum waveform in a case in which the spectral line width is set to 0.4 pm and the wavelength is controlled in the sawtooth waveform as shown in FIG. 7.
Figure 29:
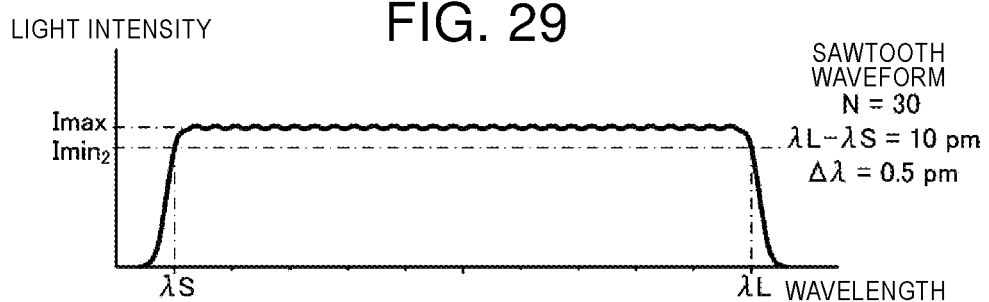
FIG. 29 shows the moving integrated spectrum waveform in a case in which the spectral line width is set to 0.5 pm and the wavelength is controlled in the sawtooth waveform as shown in FIG. 7.
Figure 30:
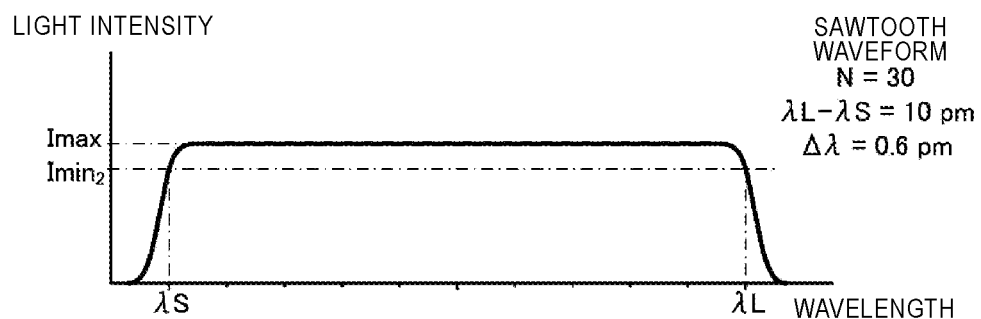
FIG. 30 shows the moving integrated spectrum waveform in a case in which the spectral line width is set to 0.6 pm and the wavelength is controlled in the sawtooth waveform as shown in FIG. 7.
Figure 31:
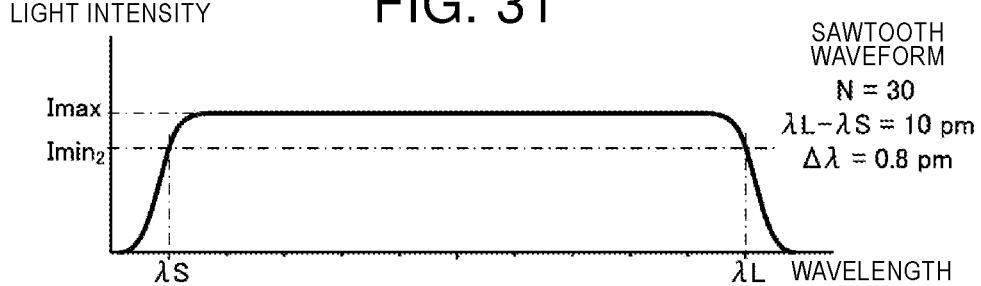
FIG. 31 shows the moving integrated spectrum waveform in a case in which the spectral line width is set to 0.8 pm and the wavelength is controlled in the sawtooth waveform as shown in FIG. 7.
Figure 32:
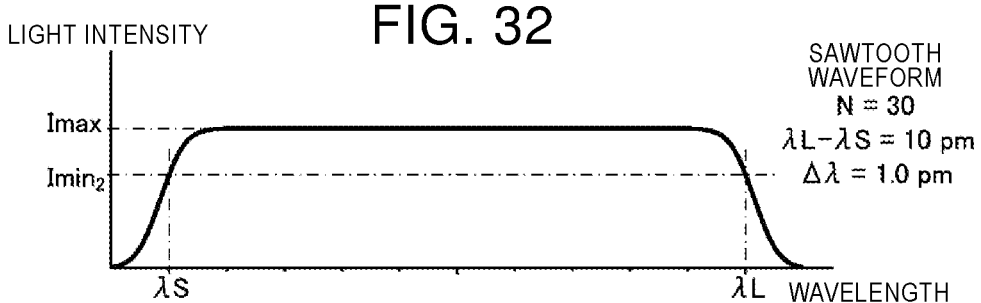
FIG. 32 shows the moving integrated spectrum waveform in a case in which the spectral line width is set to 1.0 pm and the wavelength is controlled in the sawtooth waveform as shown in FIG. 7.
Figure 33:
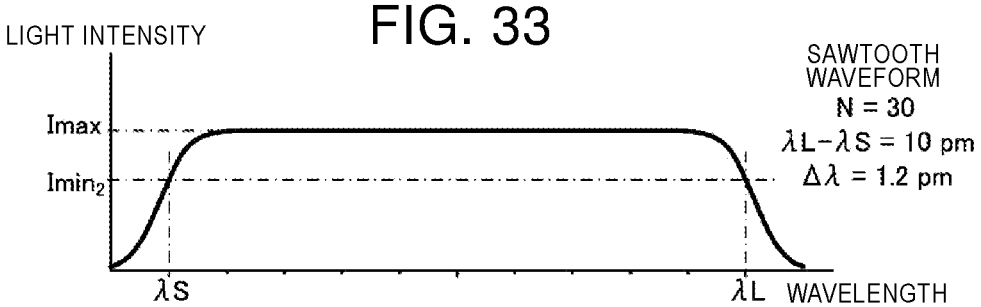
FIG. 33 shows the moving integrated spectrum waveform in a case in which the spectral line width is set to 1.2 pm and the wavelength is controlled in the sawtooth waveform as shown in FIG. 7.

As shown in FIGS. 26 to 28, the less the spectral line width $\Delta\lambda$ is, the more the steepness of the peak corresponding to each pulse in the moving integrated spectrum waveform is sharpened. Conversely, the more the spectral line width $\Delta\lambda$ is, the more the steepness of the peak corresponding to each pulse in the moving integrated spectrum waveform is moderated.

In each of FIGS. 26 to 28, maximum intensity Imax and minimum intensity Imin of the flat top region are shown. The flat top region is a wavelength region between the shortest wavelength $\lambda S$ and the longest wavelength $\lambda L$, and means a wavelength region in which the moving integrated spectrum waveform can be regarded as a flat top shape. The maximum intensity Imax of the flat top region is the maximum value of the light intensity in the wavelength region from the shortest wavelength $\lambda S$ to the longest wavelength $\lambda L$ in the moving integrated spectrum waveform. The minimum intensity Imin of the flat top region is the minimum value of the light intensity in the wavelength region from the wavelength corresponding to $\lambda S + \Delta\lambda$ to the wavelength corresponding to $\lambda L - \Delta\lambda$ in the moving integrated spectrum waveform.

As shown in FIGS. 29 to 33, when the spectral line width $\Delta\lambda$ is further increased, the wavelength region in the vicinity of the average wavelength in the moving integrated spectrum waveform has a substantially flat shape. However, as the spectral line width $\Delta\lambda$ is increased, the slope at the wavelength region in the vicinity of each of the shortest wavelength λS and the longest wavelength λL in the moving integrated spectrum waveform becomes moderated, so that a preferable flat top shape may not be obtained in some cases.

In each of FIGS. 29 to 33, the maximum intensity Imax and minimum intensity $Imin_2$ of the flat top region are shown. The minimum intensity $Imin_2$ of the flat top region is the minimum value of the light intensity in the wavelength region from the shortest wavelength λS to the longest wavelength λL in the moving integrated spectrum waveform.

In FIGS. 26 to 28, the minimum intensity $Imin_2$ is omitted. In FIGS. 29 to 33, the minimum intensity Imin is omitted.

Figure 34:
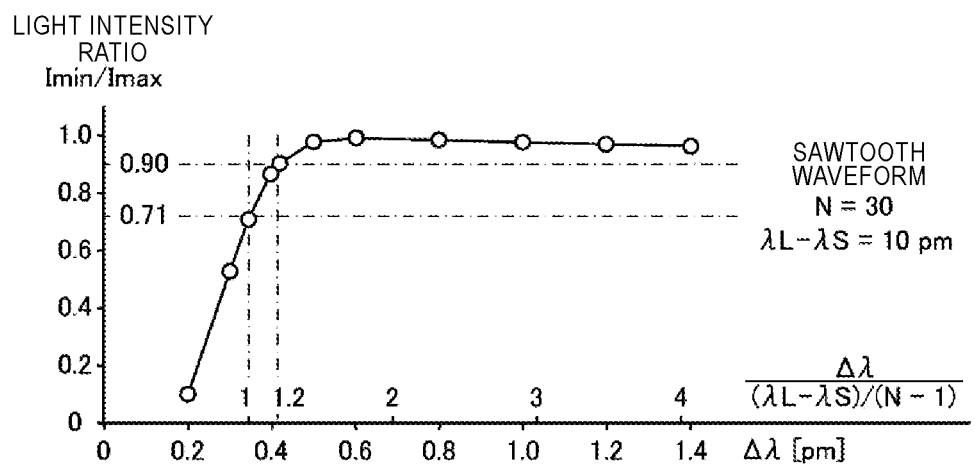
FIG. 34 is a graph showing the relationship between the spectral line width and a light intensity ratio in the case in which the wavelength is controlled in the sawtooth waveform as shown in FIG. 7.

FIG. 34 is a graph showing the relationship between the spectral line width Δλ and a light intensity ratio Imin/Imax in the case in which the wavelength is controlled in the sawtooth waveform as shown in FIG. 7. In addition to the spectral line width Δλ, normalized spectral line width Δλ/((λL−λS)/(N−1)) is shown on the horizontal axis of FIG. 34. The normalized spectral line width Δλ/((λL−λS)/(N−1)) is a parameter obtained by dividing the spectral line width Δλ by the wavelength difference (λL−λS)/(N−1) between the peaks.

The higher the light intensity ratio Imin/Imax is, the more the steepness of the moving integrated spectrum waveform is moderated. In order to obtain stable exposure performance, the light intensity ratio Imin/Imax is preferably equal to or more than 0.71, and more preferably equal to or more than 0.90.

As shown in FIG. 34, in order to set the light intensity ratio Imin/Imax to be equal to or more than 0.71, the normalized spectral line width Δλ/((λL−λS)/(N−1)) is preferably equal to or more than 1. In order to set the light intensity ratio Imin/Imax to be equal to or more than 0.90, the normalized spectral line width Δλ/((λL−λS)/(N−1)) is preferably equal to or more than 1.2.

Figure 35:
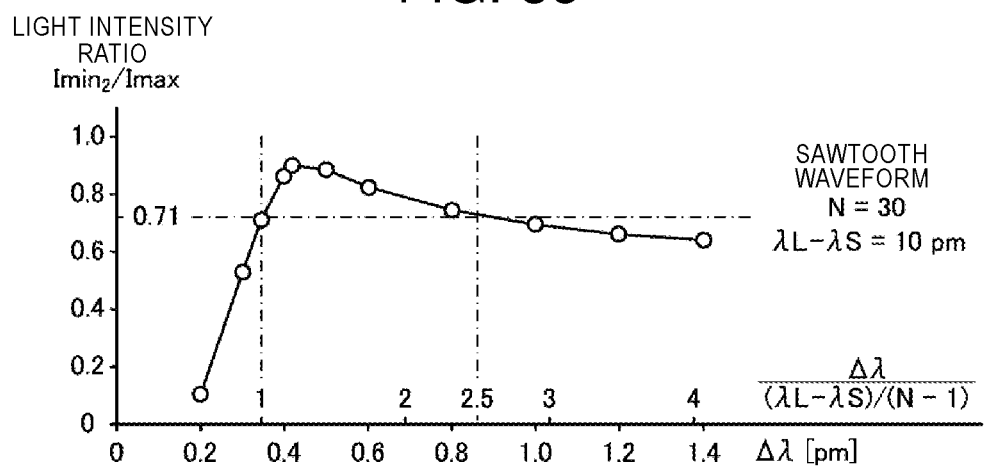
FIG. 35 is a graph showing the relationship between the spectral line width and the light intensity ratio in the case in which the wavelength is controlled in the sawtooth waveform as shown in FIG. 7.

FIG. 35 is a graph showing the relationship between the spectral line width Δλ and a light intensity ratio $Imin_2$/Imax in the case in which the wavelength is controlled in the sawtooth waveform as shown in FIG. 7. In addition to the spectral line width Δλ, normalized spectral line width Δλ/((λL−λS)/(N−1)) is shown on the horizontal axis of FIG. 35.

As the light intensity ratio $Imin_2$/Imax becomes higher, not only the steepness of the peaks corresponding to the respective pulses in the moving integrated spectrum waveform becomes moderated, but also the slope at the wavelength region in the vicinity of each of the shortest wavelength λS and the longest wavelength λL in the moving integrated spectrum waveform becomes steep, so that a preferable flat top shape is obtained. In order to obtain stable exposure performance, the light intensity ratio $Imin_2$/Imax is preferably equal to or more than 0.71.

As shown in FIG. 35, in order to set the light intensity ratio $Imin_2$/Imax to be equal to or more than 0.71, the normalized spectral line width Δλ/((λL−λS)/(N−1)) is preferably equal to or more than 1 and equal to or less than 2.5.

Based on the preferable range of the normalized spectral line width Δλ/((λL−λS)/(N−1)), the above-described coefficients Dmin, Dmax, D can be determined, and the target minimum spectral line width Δλmin, the target maximum spectral line width Δλmax, and the target spectral line width Δλt can be determined.

5.2 Case in Which Wavelength is Controlled in Triangular Waveform

FIGS. 36 to 43 show the moving integrated spectrum waveform in the case in which the wavelength is controlled in the triangular waveform as shown in FIG. 9. In FIGS. 36 to 43, the horizontal axis represents the wavelength and the vertical axis represents the light intensity. In any of FIGS. 36 to 43, the number of irradiation pulses N is 30, and the wavelength difference between the shortest wavelength λS and the longest wavelength λL is 5 pm. The spectral line widths Δλ in FIGS. 36 to 43 are different from each other. The spectral line width Δλ is 0.2 pm in FIG. 36, 0.3 pm in FIG. 37, 0.4 pm in FIG. 38, 0.5 pm in FIG. 39, 0.6 pm in FIG. 40, 0.8 pm in FIG. 41, 1.0 pm in FIGS. 42, and 1.2 pm in FIG. 43.

Figure 36:
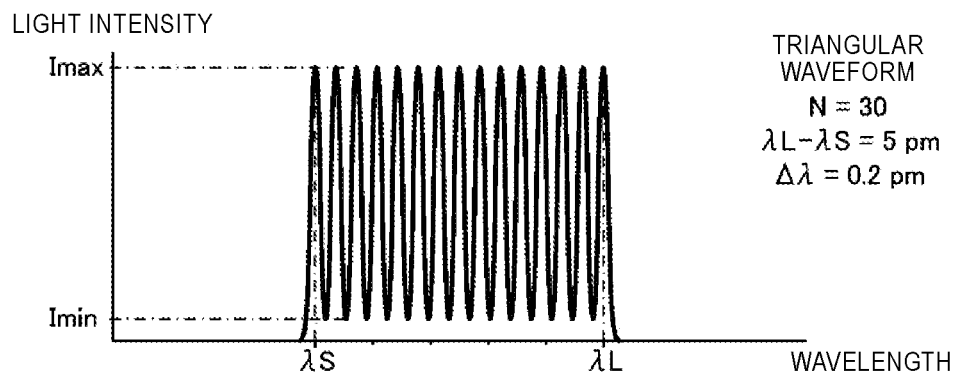
FIG. 36 shows the moving integrated spectrum waveform in a case in which the spectral line width is set to 0.2 pm and the wavelength is controlled in a triangular waveform as shown in FIG. 9.
Figure 37:
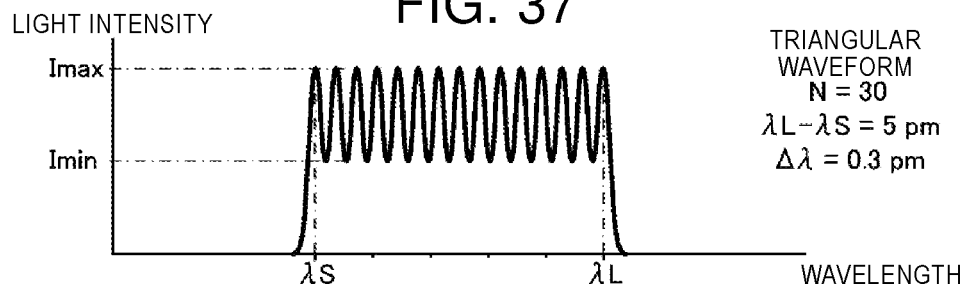
FIG. 37 shows the moving integrated spectrum waveform in a case in which the spectral line width is set to 0.3 pm and the wavelength is controlled in the triangular waveform as shown in FIG. 9.
Figure 38:
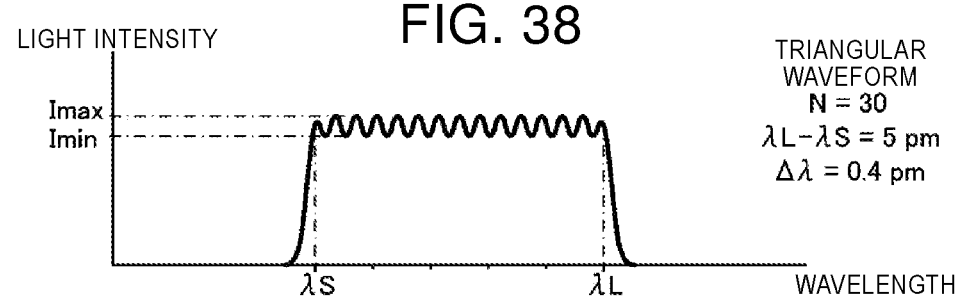
FIG. 38 shows the moving integrated spectrum waveform in a case in which the spectral line width is set to 0.4 pm and the wavelength is controlled in the triangular waveform as shown in FIG. 9.
Figure 39:
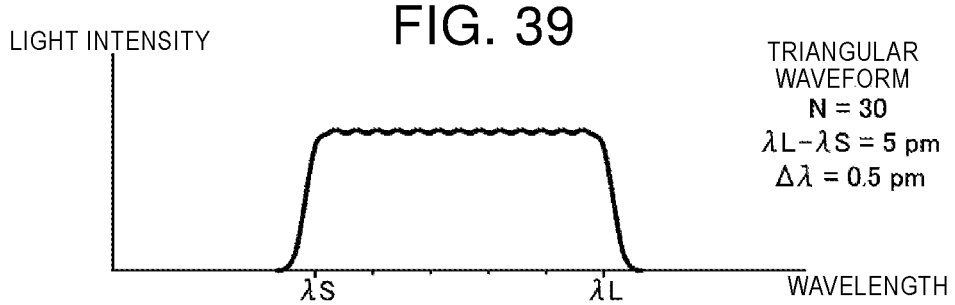
FIG. 39 shows the moving integrated spectrum waveform in a case in which the spectral line width is set to 0.5 pm and the wavelength is controlled in the triangular waveform as shown in FIG. 9.
Figure 40:
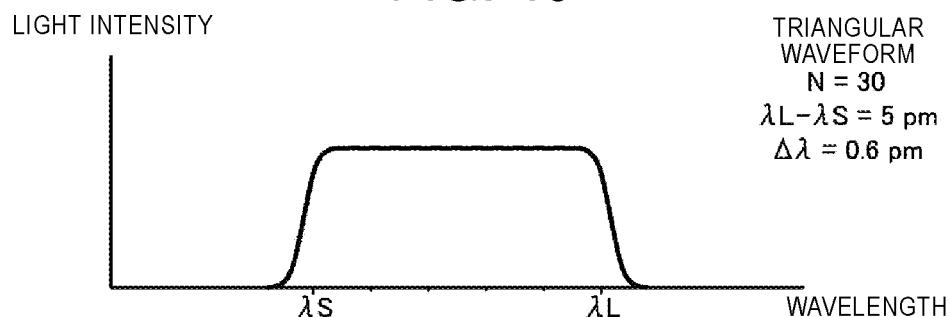
FIG. 40 shows the moving integrated spectrum waveform in a case in which the spectral line width is set to 0.6 pm and the wavelength is controlled in the triangular waveform as shown in FIG. 9.
Figure 41:
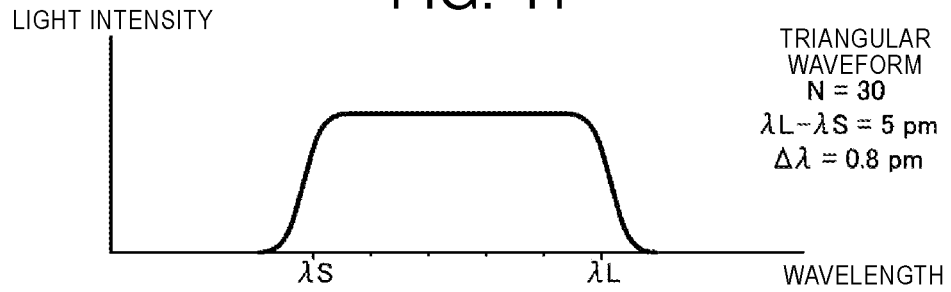
FIG. 41 shows the moving integrated spectrum waveform in a case in which the spectral line width is set to 0.8 pm and the wavelength is controlled in the triangular waveform as shown in FIG. 9.
Figure 42:
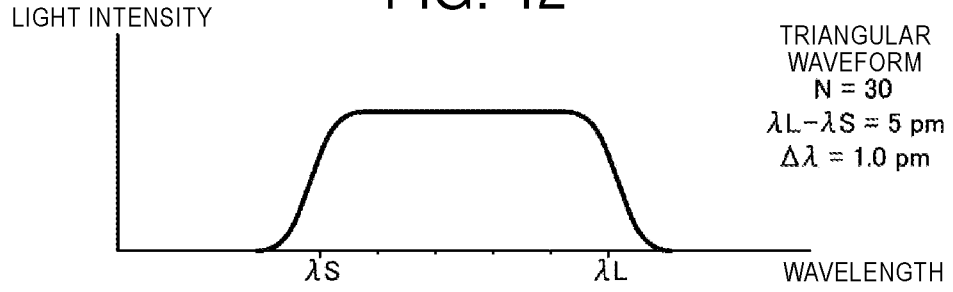
FIG. 42 shows the moving integrated spectrum waveform in a case in which the spectral line width is set to 1.0 pm and the wavelength is controlled in the triangular waveform as shown in FIG. 9.
Figure 43:
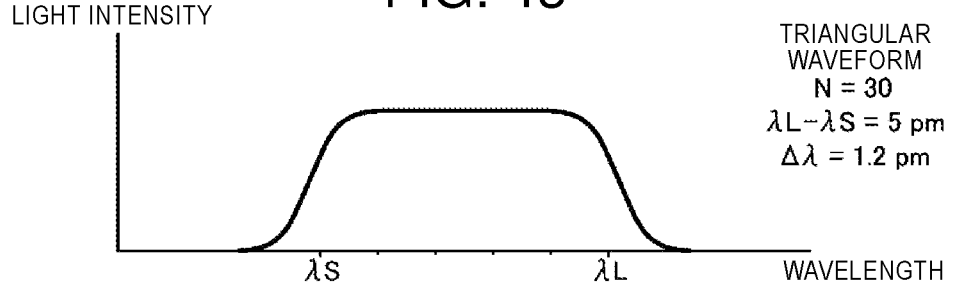
FIG. 43 shows the moving integrated spectrum waveform in a case in which the spectral line width is set to 1.2 pm and the wavelength is controlled in the triangular waveform as shown in FIG. 9.

As shown in FIGS. 36 to 38, the less the spectral line width Δλ is, the more the steepness of the peak corresponding to each pulse in the moving integrated spectrum waveform is sharpened. Conversely, the more the spectral line width Δλ is, the more the steepness of the peak corresponding to each pulse in the moving integrated spectrum waveform is moderated. In each of FIGS. 36 to 38, the maximum intensity Imax and the minimum intensity Imin of the flat top region are shown.

In FIGS. 39 to 43, the maximum intensity Imax and the minimum intensity Imin are omitted.

As shown in FIGS. 39 to 43, when the spectral line width Δλ is further increased, the wavelength region in the vicinity of the average wavelength in the moving integrated spectrum waveform has a substantially flat shape. However, as the spectral line width Δλ is increased, the slope at the wavelength region in the vicinity of each of the shortest wavelength λS and the longest wavelength λL in the moving integrated spectrum waveform becomes moderated, so that a preferable flat top shape may not be obtained in some cases.

Figure 44:
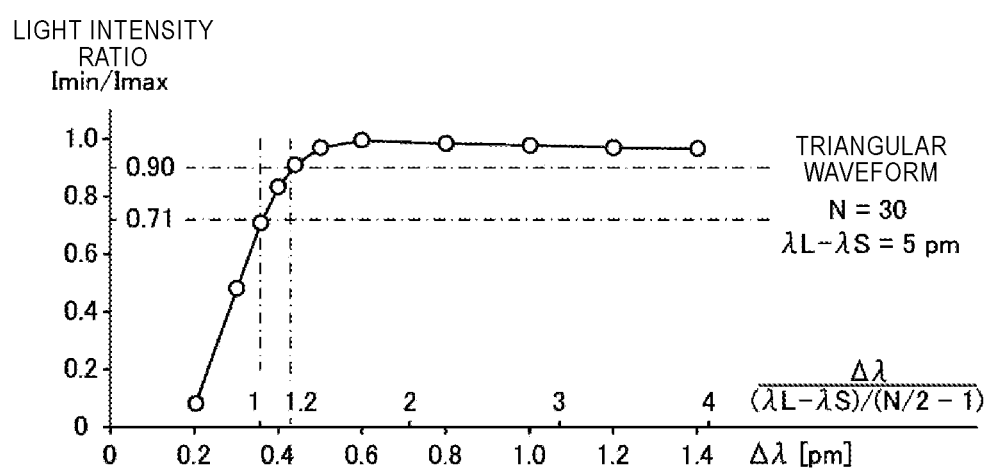
FIG. 44 is a graph showing the relationship between the spectral line width and the light intensity ratio in the case in which the wavelength is controlled in the triangular waveform as shown in FIG. 9.

FIG. 44 is a graph showing the relationship between the spectral line width Δλ and the light intensity ratio Imin/Imax in the case in which the wavelength is controlled in the triangular waveform as shown in FIG. 9. In addition to the spectral line width Δλ, normalized spectral line width Δλ/((λL−λS)/(N/2−1)) is shown on the horizontal axis of FIG. 44. The normalized spectral line width Δλ/((λL−λS)/(N/2−1)) is a parameter obtained by dividing the spectral line width Δλ by the wavelength difference (λL−λS)/(N/2−1) between the peaks.

In order to obtain stable exposure performance, the light intensity ratio Imin/Imax is preferably equal to or more than 0.71, and more preferably equal to or more than 0.90.

In order to set the light intensity ratio Imin/Imax to be equal to or more than 0.71, the normalized spectral line width Δλ/((λL−λS)/(N/2−1)) is preferably equal to or more than 1. In order to set the light intensity ratio Imin/Imax to be equal to or more than 0.90, the normalized spectral line width Δλ/((λL−λS)/(N/2−1)) is preferably equal to or more than 1.2.

Although the relationship between the spectral line width Δλ and the light intensity ratio $Imin_2$/Imax in the case in which the wavelength is controlled in the triangular waveform is not shown, similarly to the description with reference to FIG. 35, the normalized spectral line width Δλ/((λL−λS)/(N/2−1)) is preferably equal to or less than 2.5.

Based on the preferable range of the normalized spectral line width Δλ/((λL−λS)/(N/2−1)), the above-described coefficients Dmin, Dmax, D can be determined, and the target minimum spectral line width Δλmin, the target maximum spectral line width Δλmax, and the target spectral line width Δλt can be determined.

6. Others

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that embodiments of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of any thereof and any other than A, B, and C.

What is claimed is:

1. A laser device comprising:
   a first actuator configured to adjust an oscillation wavelength of pulse laser light;
   a second actuator configured to adjust a spectral line width of the pulse laser light; and
   a processor configured to determine a target spectral line width by reading data specifying a number of irradiation pulses of the pulse laser light with which one location of an irradiation receiving object is irradiated and a difference between a shortest wavelength and a longest wavelength, control the second actuator based on the target spectral line width, and control the first actuator so that the oscillation wavelength periodically changes every number of the irradiation pulses between the shortest wavelength and the longest wavelength.

2. The laser device according to claim 1, further comprising:
   a shutter arranged on an optical path of the pulse laser light,
   wherein the processor determines a target minimum spectral line width as the target spectral line width, closes the shutter, controls the second actuator so that the spectral line width gradually increases, and opens the shutter when a measurement value of the spectral line width becomes equal to or more than the target minimum spectral line width.

3. The laser device according to claim 1, further comprising:
   a shutter arranged on an optical path of the pulse laser light,
   wherein the processor determines a target minimum spectral line width and a target maximum spectral line width as the target spectral line width, closes the shutter, controls the second actuator so that the spectral line width changes, and opens the shutter when a measurement value of the spectral line width becomes equal to or more than the target minimum spectral line width and equal to or less than the target maximum spectral line width.

4. The laser device according to claim 1,
   wherein the processor determines the target spectral line width such that the target spectral line width in a case in which the difference is a third value which is more than a first value and the number of irradiation pulses is a fourth value which is equal to or less than a second value is larger than that in a case in which the difference is the first value and the number of irradiation pulses is the second value.

5. The laser device according to claim 1,
   wherein the processor determines the target spectral line width such that the target spectral line width in a case in which the difference is a third value which is equal to or more than a first value and the number of irradiation pulses is a fourth value which is less than a second value is larger than that in a case in which the difference is the first value and the number of irradiation pulses is the second value.

6. The laser device according to claim 1,
   wherein a moving integrated spectrum waveform for every number of the irradiation pulses of the pulse laser light includes a plurality of peaks, and
   the processor determines the target spectral line width such that the spectral line width increases as a wavelength difference between the peaks increases.

7. The laser device according to claim 1,
   wherein the processor determines the target spectral line width such that the spectral line width increases as a value obtained by dividing the difference by a value which is obtained by subtracting 1 from the number of irradiation pulses.

8. The laser device according to claim 1,
   wherein the processor determines the target spectral line width such that the spectral line width increases as a value increases, the value being obtained by dividing the difference by a value which is obtained by dividing the number of irradiation pulses by 2 and subtracting 1.

9. The laser device according to claim 1,
   wherein the processor determines the target spectral line width such that a light intensity ratio obtained by dividing minimum intensity of a flat top region in a moving integrated spectrum waveform for every number of the irradiation pulses of the pulse laser light by maximum intensity of the flat top region is equal to or more than 0.71.

10. The laser device according to claim 9,
    wherein the minimum intensity is a minimum value of light intensity, in the moving integrated spectrum waveform, in a wavelength region from a value obtained by adding the spectral line width to the shortest wavelength to a value obtained by subtracting the spectral line width from the longest wavelength.

11. The laser device according to claim 9,
    wherein the minimum intensity is a minimum value of a light intensity in the wavelength region from the shortest wavelength to the longest wavelength in the moving integrated spectrum waveform.

12. The laser device according to claim 9,
    wherein the processor determines the target spectral line width such that the light intensity ratio is equal to or more than 0.90.

13. The laser device according to claim 1,
    wherein a moving integrated spectrum waveform for every number of the irradiation pulses of the pulse laser light includes a plurality of peaks, and
    the processor determines the target spectral line width such that a parameter obtained by dividing the spectral line width by a wavelength difference between the peaks is equal to or more than 1.

14. The laser device according to claim 13,
    wherein the processor determines the target spectral line width such that the parameter is equal to or less than 2.5.

15. The laser device according to claim 13,
wherein the processor determines the target spectral line width such that the parameter is equal to or more than 1.2.

16. The laser device according to claim 1,
wherein the processor determines the target spectral line width such that a parameter obtained by dividing the spectral line width by a value is equal to or more than 1, the value being obtained by dividing the difference by a value which is obtained by subtracting 1 from the number of irradiation pulses.

17. The laser device according to claim 16,
wherein the processor determines the target spectral line width such that the parameter is equal to or less than 2.5.

18. The laser device according to claim 1,
wherein the processor determines the target spectral line width such that a parameter obtained by dividing the spectral line width by a value is equal to or more than 1, the value being obtained by dividing the difference by a value which is obtained by dividing the number of irradiation pulses by 2 and subtracting 1.

19. The laser device according to claim 18,
wherein the processor determines the target spectral line width such that the parameter is equal to or less than 2.5.

20. An electronic device manufacturing method, comprising:
generating pulse laser light using a laser device;
outputting the pulse laser light to an exposure apparatus; and
exposing a photosensitive substrate to the pulse laser light in the exposure apparatus to manufacture an electronic device,
the laser device including:
a first actuator configured to adjust an oscillation wavelength of the pulse laser light;
a second actuator configured to adjust a spectral line width of the pulse laser light; and
a processor configured to determine a target spectral line width by reading data specifying a number of irradiation pulses of the pulse laser light with which one location of an irradiation receiving object is irradiated and a difference between a shortest wavelength and a longest wavelength, control the second actuator based on the target spectral line width, and control the first actuator so that the oscillation wavelength periodically changes every number of the irradiation pulses between the shortest wavelength and the longest wavelength.

\* \* \* \* \*